(12) United States Patent
Asami et al.

(10) Patent No.: US 8,929,089 B2
(45) Date of Patent: Jan. 6, 2015

(54) ELECTRONIC CIRCUIT MODULE COMPONENT AND METHOD OF MANUFACTURING ELECTRONIC CIRCUIT MODULE COMPONENT

(75) Inventors: Shigeru Asami, Tokyo (JP); Seiichi Tajima, Tokyo (JP); Hiroki Hara, Tokyo (JP); Shuichi Takizawa, Tokyo (JP); Masumi Kameda, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 737 days.

(21) Appl. No.: 13/044,871

(22) Filed: Mar. 10, 2011

(65) Prior Publication Data

US 2011/0229708 A1 Sep. 22, 2011

(30) Foreign Application Priority Data

Mar. 17, 2010 (JP) ................................. 2010-061454
Dec. 16, 2010 (JP) ................................. 2010-280900

(51) Int. Cl.
*H05K 7/00* (2006.01)
*H01L 23/00* (2006.01)
*H01L 23/31* (2006.01)
*H01L 23/29* (2006.01)
*H01L 23/552* (2006.01)
*H01L 25/16* (2006.01)

(52) U.S. Cl.
CPC ............. *H01L 23/3135* (2013.01); *H01L 25/16* (2013.01); *H01L 2924/01029* (2013.01); *H01L 2224/97* (2013.01); *H01L 24/97* (2013.01); *H01L 2924/014* (2013.01); *H01L 23/564* (2013.01); *H01L 23/295* (2013.01); *H01L 2224/16225* (2013.01); *H01L 23/3128* (2013.01); *H01L 2224/16227* (2013.01); *H01L 23/552* (2013.01)
USPC .......................................................... 361/760

(58) Field of Classification Search
USPC ........... 361/760, 761, 748; 428/316.6; 257/98
See application file for complete search history.

(56) References Cited

U.S. PATENT DOCUMENTS

| 7,478,474 | B2 | 1/2009 | Koga | |
| 2008/0135862 | A1* | 6/2008 | Maeda et al. | 257/98 |
| 2011/0013368 | A1* | 1/2011 | Nagaike | 361/728 |

FOREIGN PATENT DOCUMENTS

JP    A 2006-332255    12/2006

* cited by examiner

*Primary Examiner* — Andargie M Aychillhum
(74) *Attorney, Agent, or Firm* — Oliff PLC

(57) ABSTRACT

An electronic circuit module component includes an electronic component, a substrate, a first resin, a second resin, a metal layer, and an opening. The electronic component is mounted on the substrate. The first resin has pores and is in contact with at least a part of the electronic component. The second resin covers a surface of the first resin and has porosity which is lower than that of the first resin. The metal layer covers the first resin and the second resin and is electrically connected to a ground of the substrate. The opening is provided in the metal layer and allows a part of the first resin to be exposed to an outside at least of the metal layer.

4 Claims, 18 Drawing Sheets

ELECTRONIC CIRCUIT MODULE COMPONENT AND METHOD OF MANUFACTURING ELECTRONIC CIRCUIT MODULE COMPONENT

CROSS-REFERENCE TO RELATED APPLICATIONS

This application is based upon and claims the benefit of priority from Japanese Patent Application No. 2010-061454, filed on Mar. 17, 2010, and Japanese Patent Application No. 2010-280900, filed on Dec. 16, 2010, the entire contents of which are incorporated herein by reference.

BACKGROUND OF THE INVENTION

1. Field of the Invention

The present invention relates to an electronic circuit module component in which a metal layer is formed on a surface of an insulating resin covering an electronic component and a method of manufacturing the electronic circuit module component.

2. Description of the Related Art

In an electronic circuit module component, a plurality of electronic components such as a passive element and an active element or an IC (Integrated Circuit) is mounted on a substrate to function as a unit of electronic components having a function or a plurality of functions. For example, Japanese Laid-open Patent Publication No. 2006-332255 discloses an electronic circuit unit in which entire electronic components are covered with a sealing resin made from an insulating material, the electronic component in the embedded state is provided on an entire part of an upper surface of a multilayer substrate, and a metal film formed by plating or the like is provided on an entire surface of an upper surface of the sealing resin, an entire surface of a pair of opposed lateral surfaces of the sealing resin, and an entire surface of a pair of opposed lateral surfaces of the multilayer substrate positioned between the upper surface of the multilayer substrate and a ground pattern between the stacked layers.

In an electronic circuit module component, electronic component mounted on a substrate are covered with an insulating resin, and, depending on a production process or a storage environment of the electronic circuit module component, moisture enters inside the insulating resin or the substrate and the electronic module component in some cases. The moisture is evaporated and expanded when heated in a reflowing step when mounting the electronic circuit module component to an electronic appliance. In the technology disclosed in Japanese Laid-open Patent Publication No. 2006-332255, since the metal layer is formed as a shield layer on the entire surface of the insulating resin, a gas such as a water vapor generated by heating during reflow is hardly discharged from the insulating resin, thereby entailing a risk of a crack in the insulating resin or the substrate and a risk of deformation and the like of the electronic circuit module component.

SUMMARY OF THE INVENTION

An electronic circuit module component according to an aspect of the present invention includes an electronic component; a substrate on which the electronic component is mounted; a first resin that has pores and is in contact with at least a part of the electronic component; a second resin that covers the first resin and has a porosity lower than that of the first resin; a metal layer that covers the first resin and the second resin and is electrically connected to a ground of the substrate; and an opening that is provided in the metal layer and allows a part of the first resin to be exposed to an outside at least of the metal layer.

A method of manufacturing an electronic circuit module component according to another aspect of the present invention includes mounting an electronic component on a substrate; providing a first resin on the substrate on which the electronic component is mounted in such a manner that the first resin is in contact with at least a part of the electronic component; covering the first resin with a second resin; cutting at least a part of a rim of a portion to be used as the electronic circuit module component partway through the substrate and cutting a rest of the portion partway through a layer of the second resin; forming a metal layer on surfaces of the first resin and the second resin; and cutting a rim of the electronic circuit module component to the substrate.

A method of manufacturing an electronic circuit module component according to still another aspect of the present invention includes mounting an electronic component on a substrate; providing a first resin on the substrate on which the electronic component is mounted in such a manner that the first resin is in contact with at least a part of the electronic component; covering the first resin with a second resin; cutting at least a part of a rim of a portion to be used as the electronic circuit module component partway through the substrate and cutting a rest of the portion partway through a layer of the first resin; forming a metal layer on surfaces of the first resin and the second resin; and cutting a rim of the electronic circuit module component to the substrate.

A method of manufacturing an electronic circuit module component according to still another aspect of the present invention includes mounting an electronic component on a substrate; providing a first resin on the substrate on which the electronic component is mounted in such a manner that the first resin is in contact with at least a part of the electronic component; covering the first resin with a second resin; cutting a part of a rim of a portion to be used as the electronic circuit module component to the substrate; forming a metal layer on surfaces of the first resin and the second resin; and cutting an entire part of the rim of the portion to be used as the electronic circuit module component to the substrate.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment of the present invention will be described in detail with reference to the accompanying drawings. The embodiment does not limit the present invention. Also, constituent elements disclosed in the embodiment include those easily conceivable by skilled person and those substantially equivalent thereto, i.e. those within an equivalent range. Further, it is possible to combine as required the constituent elements disclosed in the embodiment.

Figure 1:
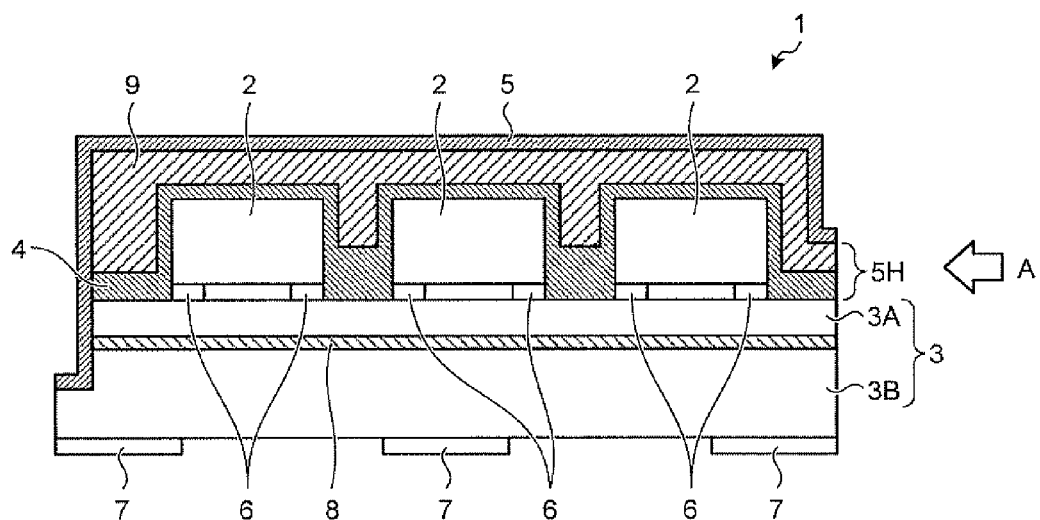
FIG. 1 is a sectional view showing an electronic circuit module component according to the present embodiment.
Figure 2:
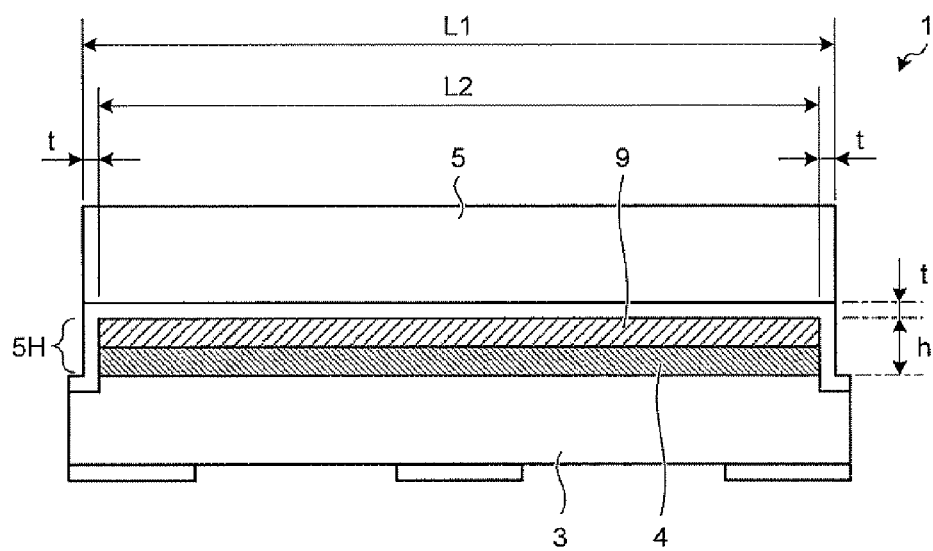
FIG. 2 is a front view showing the electronic circuit module component according to the present embodiment as viewed from a direction of an arrow A of FIG. 1.
Figure 3:
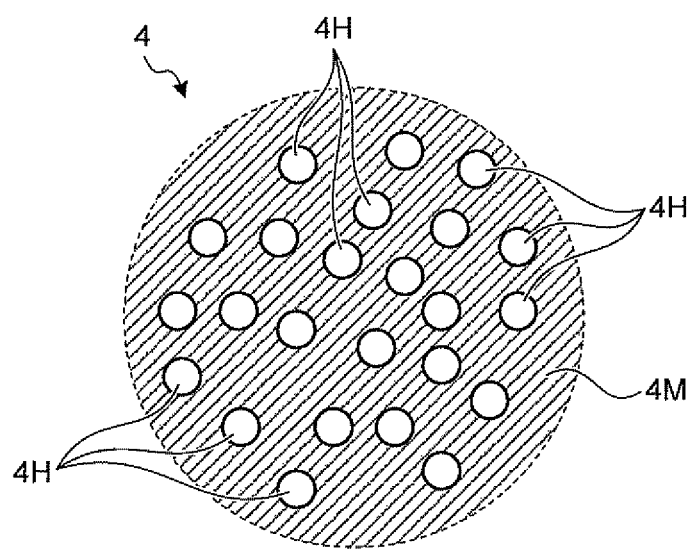
FIG. 3 is a conceptual diagram showing a first resin of the electronic circuit module component according to the present embodiment.

FIG. 1 is a sectional view showing an electronic circuit module component according to the present embodiment. FIG. 2 is a front view showing the electronic circuit module component according to the present embodiment as viewed from a direction of an arrow A of FIG. 1. FIG. 3 is a conceptual diagram showing a first resin of the electronic circuit module component according to the present embodiment. As shown in FIG. 1, in an electronic circuit module component 1, a plurality of electronic components 2 are mounted to a substrate 3 to function as an electronic component having a collective function which is a function or a plurality of functions. The electronic components 2 may be mounted on a surface of the substrate 3 or mounted inside the substrate 3. In the present embodiment, examples of the electronic components 2 forming the electronic circuit module component 1 includes a passive element such as a coil, a capacitor, and a resistor and an active element such as a diode and a transistor. The electronic components 2 are not limited to the above-described components.

As shown in FIG. 1, the electronic circuit module component 1 includes the electronic components 2, the substrate 3, a first resin 4, a second resin 9, a metal layer 5, and an opening 5H. The electronic components 2 are mounted to the substrate 3. The electronic components 2 are mounted on a mounting surface (a surface to which the electronic components 2 are mounted) of the substrate 3 by a solder 6. The substrate 3 has a ground 8 between a first substrate 3A and a second substrate 3B. The ground 8 is an electric good conductor such as Cu and electrically connected to a terminal connected to terminals of the electronic components 2 provided on the mounting surface of the substrate 3 via a through-hole or the like. In the case where a ground terminal is provided on the mounting surface, the ground 8 is electrically connected to the ground terminal via the through-hole or the like. The substrate 3 has a terminal electrode (module terminal electrode) 7 on a side reverse to the mounting surface. The module terminal electrode 7 is electrically connected to the electronic components 2 provided in the electronic circuit module component 1. Also, in the case where the ground terminal is provided on the reverse side of the mounting surface, the ground terminal and the ground 8 are electrically connected to each other. Also, the substrate 3 has a circuit pattern at least on the surface, and another circuit pattern is provided inside (for example, between the first substrate 3A and the second substrate 3B) the substrate 3 as required.

The first resin 4 is in contact with at least a part of the electronic components 2. As shown in FIG. 3, the first resin 4 has pores 4H in a resin 4M. The second resin 9 covers a surface of the first resin 4 and has low porosity than that of the first resin 4. The porosity is a ratio (vol %) of a volume of pores existing per unit volume. By keeping the porosity of the second resin 9 to be lower than that of the first resin 4, the second resin 9 becomes stronger than the first resin 4. Sufficient strength of the electronic circuit module component 1 is ensured by sealing the electronic components 2 to the substrate 3 together with the first resin 4 by using the second resin 9. The porosity of the second resin 9 may be 0 vol %.

Each of the first resin 4 and the second resin 9 is an insulating resin having electric insulation property and has a function of sealing the electronic components 2 on the substrate 3. In the first resin 4 and the second resin 9, a heat-curable resin (for example, an epoxy resin without limitation thereto), for example, is hardened by adding a filler (for example, silica or alumina) thereto, so that the heat-curable resin is blended with a part of gaps between filler particles to form the pores.

The metal layer 5 covers the first resin 4 and the second resin 9 and is electrically connected to the ground 8 of the substrate 3. In the present embodiment, the metal layer 5 is a thin film made of a conductive material (material having conductivity, which is a metal in the present embodiment). In the present embodiment, the metal layer 5 may be formed of a single conductive material or a layer of a plurality of conductive materials. The metal layer 5 is formed by plating, for example. The metal layer 5 covers the surfaces of the first resin 4 and the second resin 9 to shield the electronic components 2 sealed by the first resin 4 and the second resin 9 from a high frequency noise, an electromagnetic wave noise, and the like from an outside of the electronic circuit module component 1 or from a high frequency noise and an electromagnetic noise radiated from the electronic components 2.

Thus, the metal layer 5 functions as an electromagnetic shield. By using the metal layer 5 as the electromagnetic shield, it is possible to downsize an outer shape of the electronic circuit module component 1 as compared to the case of using a metal plate member as the electromagnetic shield.

An opening 5H is provided on the metal layer 5 and allows at least a part of the first resin 4 to be exposed to an outside of the metal layer 5, i.e. to the outside of the electronic circuit module component 1. As shown in FIG. 1 and FIG. 2, the opening 5H allows the first resin 4 and the second resin 9 to be partially exposed to the outside of the metal layer in the present embodiment. As described later in this specification, the opening 5H may allow only the first resin 4 to be partially exposed to the outside the metal layer 5. The opening 5H has a rectangular shape in plan view and is opened on an entire part of one side of the electronic circuit module component 1 which has a quadrangular shape such as an oblong shape and a square shape in plan view. The plan view of the electronic circuit module component 1 means the electronic circuit module component 1 as viewed from a direction perpendicular to a plate surface of the substrate 3 of the electronic circuit module component 1.

The shape of the electronic circuit module component 1 in plan view is not limited to the oblong shape and the square shape insofar as the shape is the quadrangular shape. The shape may be a trapezoid or a rhomboid (same applies to the following description). Also, the shape of the opening 5H is not limited to the rectangular shape. When a thickness of the metal layer 5 is t; a length of the side of the electronic circuit module component 1 to which the opening 5H is provided is L1, and a length of a long side of the opening 5H is L2, $L1=L2+2\times t$ is satisfied. A height of the opening 5H (dimension of the opening 5H in a direction perpendicular to the substrate 3) is h, which is set depending on an electromagnetic wave shielding capability of the metal layer 5.

Figure 4:
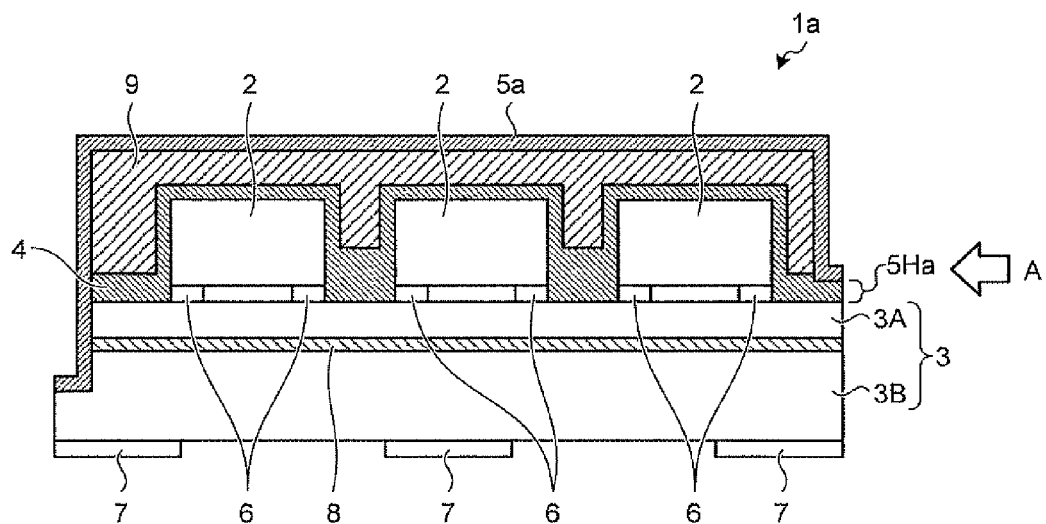
FIG. 4 is a sectional view showing an electronic circuit module component according to a modification example of the present embodiment.
Figure 5:
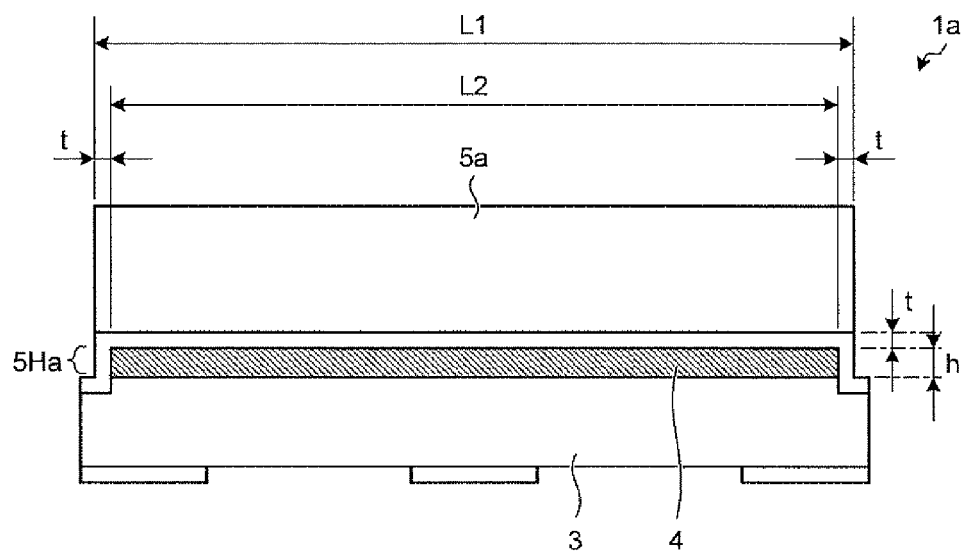
FIG. 5 is a front view showing the electronic circuit module component according to the modification example of the present embodiment as viewed from a direction of an arrow A of FIG. 4.

FIG. 4 is a sectional view showing an electronic circuit module component according to a modification example of the present embodiment. FIG. 5 is a front view showing the electronic circuit module component according to the modification example of the present embodiment as viewed from a direction of an arrow A of FIG. 4. An electronic circuit module component 1a is substantially the same as the electronic circuit module component 1 described above, wherein an opening 5Ha is different by the feature of allowing only a part of a first resin 4 to be exposed to an outside of a metal layer 5a. Other parts of the configuration are the same as those of the electronic circuit module component 1.

As shown in FIG. 4, the opening 5Ha of the electronic circuit module component 1a partially overlaps with the first resin 4 in a direction of a height of the electronic circuit module component 1a. With such configuration, the opening 5Ha allows only the first resin 4 to be partially exposed to an outside of the metal layer 5a. A height h of the opening 5Ha is smaller than that of the opening 5H of the electronic circuit module component 1 shown in FIG. 2. Therefore, the electronic circuit module component 1a is capable of increasing an area to be covered with the metal layer 5a in the first resin 4 and a second resin 9 as compared to the electronic circuit module component 1. In other words, it is possible to downsize the opening 5Ha in the electronic circuit module component 1a as compared to the above-described electronic circuit module component 1. As a result, the electronic circuit module component 1a is capable of more easily improving a shielding function of the metal layer 5a.

Figure 6:
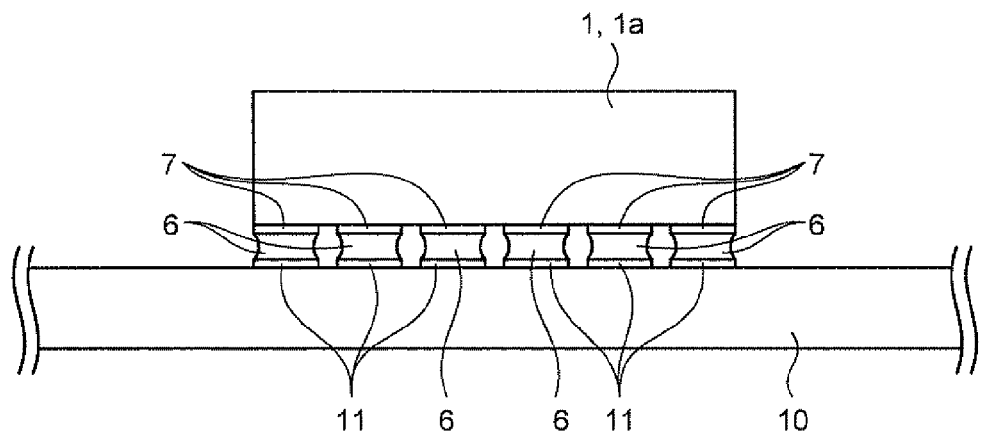
FIG. 6 is a side view showing a state in which the electronic circuit module component according to the present embodiment or the modification example thereof is mounted to a substrate.

FIG. 6 is a side view showing a state in which the electronic circuit module component according to the present embodiment or the modification example thereof is mounted to a substrate. The electronic circuit module component 1, 1*a* is bonded to a terminal electrode (mounting substrate terminal electrode) 11 of a substrate (substrate provided in an electronic appliance and hereinafter referred to as mounting substrate) 10 by a solder 6. The material to be used for bonding the electronic circuit module component 1, 1*a* and the mounting substrate terminal electrode 11 to each other is not limited to the solder. For instance, the electronic circuit module component 1, 1*a* and the mounting substrate terminal electrode 11 may be bonded to each other by using a conductive paste, a conductive adhesive agent, or the like. With such configuration, the electronic circuit module component 1, 1*a* is mounted to the mounting substrate 10. Electronic signals and power are sent and received between electronic components 2 and the mounting substrate 10.

The mounting substrate 10 shown in FIG. 6 is a substrate on which the electronic circuit module component 1, 1*a* is mounted and mounted to an electronic appliance (in-vehicle electronic appliance, mobile electronic appliance, or the like). The electronic circuit module component 1, 1*a* is mounted to the mounting substrate of the electronic appliance (secondary mounting) to be one of components to enable a function of the electronic appliance. In the case of mounting the electronic circuit module component 1, 1*a* to the mounting substrate 10, a solder paste containing the solder 6 is applied on the mounting substrate terminal electrode 11 by printing or the like, and the electronic circuit module component 1, 1*a* is mounted on the mounting substrate 10 by using a mounting apparatus. The mounting substrate 10 on which the electronic circuit module component 1, 1*a* is mounted is passed through a reflow furnace, so that a module terminal electrode 7 and the mounting substrate terminal electrode 11 are bonded to each other. Thus, the electronic circuit module component 1, 1*a* is mounted to the mounting substrate 10.

In the electronic circuit module component 1, 1*a*, moisture can sometimes enter inside the first resin 4 and the second resin 9 (hereinafter referred to as insulating resin as required) when the electronic components 2 are mounted to the substrate 3 or depending on a period and an environment of storage of the electronic circuit module component 1. For example, the moisture enters from surfaces of the insulating resin and the substrate 3 and a contact interface between the insulating resin and the substrate 3 in the case where the substrate 3 is a resin substrate, and the moisture enters from the insulating resin and the contact interface between the insulting resin and the substrate 3 in the case where an inorganic material such as ceramic is used for the substrate 3. Therefore, by the reflow for mounting the electronic circuit module component 1, 1*a* to the mounting substrate 10, the moisture entered inside the electronic circuit module component 1, 1*a* is evaporated to generate a water vapor (gas).

Since the metal layer 5 covers the surface of the insulating resin in the electronic circuit module component 1, 1*a*, the evaporated moisture is hardly discharged from the insulating resin. Therefore, a pressure (hereinafter referred to as component internal pressure) inside the electronic circuit module component 1, 1*a* is increased. As a result, there are risks that a crack or the like occurs in the insulating resin and that the electronic circuit module component 1, 1*a* is deformed. In order to suppress the risks of the crack in the insulating resin and the deformation of the electronic circuit module component 1, 1*a*, the opening 5H, 5Ha is provided on the metal layer 5, 5*a* to allow the moisture (water vapor which is gas) which is evaporated and expanded by heating during the reflow to be easily discharged from the electronic circuit module component 1, 1*a*, so that the increase in inner pressure in the electronic circuit module component 1, 1*a* is suppressed.

Figure 7:
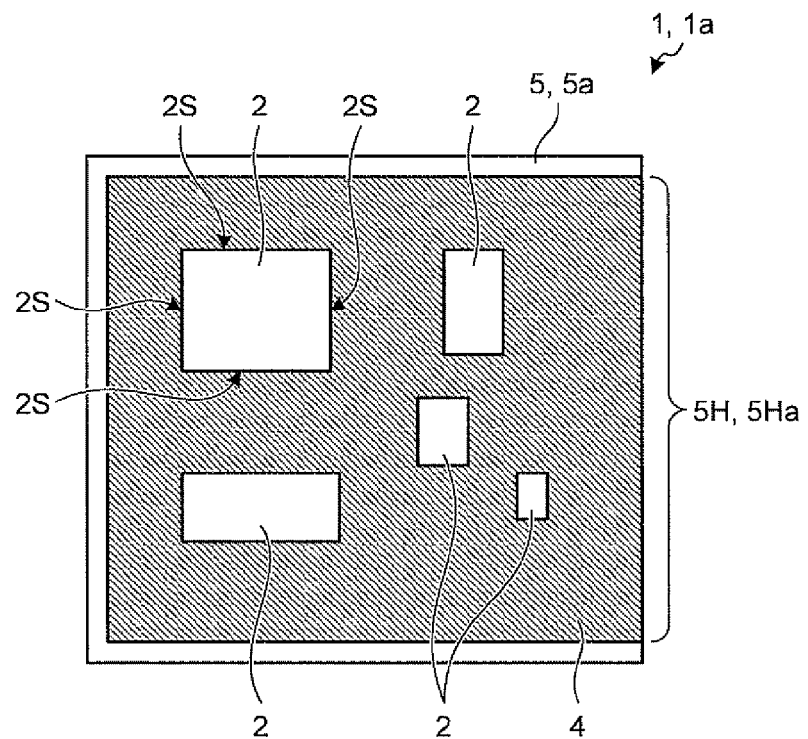
FIG. 7 is a plan view showing a state in which the electronic circuit module component according to the present embodiment or the modification example thereof is cut in a direction parallel to the substrate.
Figure 8:
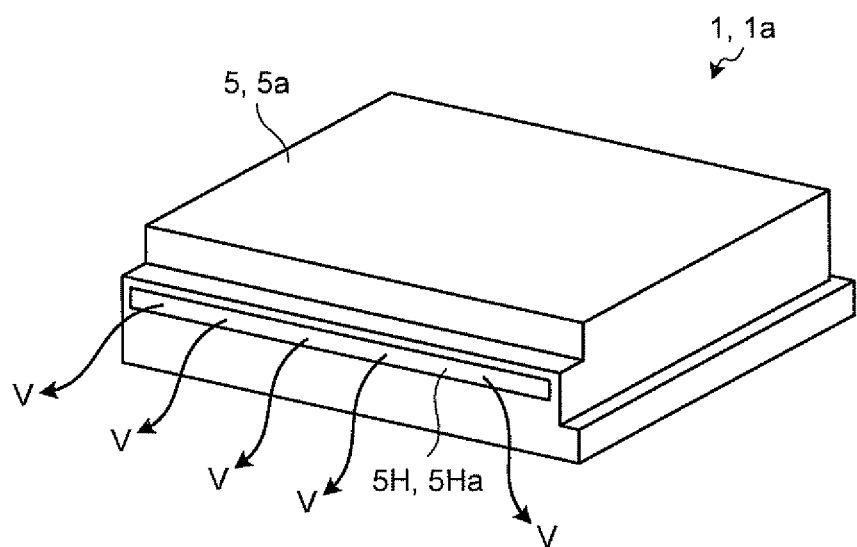
FIG. 8 is a perspective view showing the electronic circuit module component according to the present embodiment or the modification example thereof.

FIG. 7 is a plan view showing a state in which the electronic circuit module component according to the present embodiment or the modification example thereof is cut in a direction parallel to the substrate. FIG. 8 is a perspective view showing the electronic circuit module component according to the present embodiment or the modification example thereof. The electronic circuit module component 1, 1*a* has a plurality of electronic components 2. A first resin 4 is in contact with at least a part of the plurality of electronic components 2. In the present embodiment and the modification example thereof, the first resin 4 covers all of the electronic components 2 as shown in FIG. 1 and FIG. 4, and the first resin 4 is in contact with an entire part of top parts of all of the electronic components 2. Further, as shown in FIG. 1, FIG. 4, and FIG. 7, the first resin 4 is in contact with an entire part of lateral parts of all of the electronic components 2. With such configuration, in the electronic circuit module component 1, 1*a*, the first resin 4 is in contact with a surface of the electronic components 2 except for an inner surface opposed to the substrate, and the first resin 4 is in contact with all of the electronic components 2. At least a part of the first resin 4 is exposed to an outside of the metal layer 5, 5*a* at a position of the opening 5H, 5Ha. Therefore, at least a part of the entire electronic components 2 is connected to the opening 5H, 5Ha via the first resin 4.

Since the first resin 4 has pores, a gas easily passes therethrough. Therefore, by adopting the configuration described above, a gas V such as the water vapor generated inside the electronic circuit module component 1, 1*a* due to the heating during reflow is rapidly discharged to an outside of the electronic circuit module component 1, 1*a* via the opening 5H, 5Ha after passing through pores 4H of the first resin 4 shown in FIG. 3. As a result, since the increase in component inner pressure is suppressed even in the case where the electronic circuit module component 1, 1*a* has the metal layer 5, it is possible to effectively suppress the risks of crack in the insulating resin and deformation of the electronic circuit module component 1, 1*a*. Thus, according to the present embodiment and the modification example thereof, it is possible to suppress generation of defects in the electronic circuit module component 1, 1*a*. Also, according to the present embodiment and the modification example thereof, since it is possible to effectively suppress the generation of defect in the electronic circuit module component 1, 1*a* and maintain the quality of the electronic circuit module component 1, 1*a*, the electronic circuit module component 1, 1*a* is enabled to satisfactorily exhibit the function thereof.

The opening 5H, 5Ha of the electronic circuit module component 1, 1*a* is opened over an entire part of one side of the electronic circuit module component 1, 1*a* which has an oblong shape or a square shape in plan view. Therefore, the gas V inside the electronic circuit module component 1, 1*a* is discharged to the outside of the electronic circuit module component 1, 1*a* from the entire area of the side of the electronic circuit module component 1, 1*a*. As a result, since the opening 5H, 5Ha is capable of effectively discharging the gas generated in the electronic circuit module component 1, 1*a*, it is possible to reliably avoid the risks of the crack in the insulating resin and the deformation of the electronic circuit module component 1, 1*a*.

The electromagnetic wave noise shielding function of the metal layer 5, 5*a* is reduced along with a reduction in height h of the opening 5H, 5Ha. It is possible to ensure the area of the opening 5H, 5Ha while suppressing the increase in height h of the opening 5H, 5Ha by providing the opening 5H, 5Ha over the entire part of one side of the electronic circuit module component 1, 1*a*. Therefore, since it is possible to suppress the height h of the opening 5H, 5Ha by providing the opening 5H, 5Ha over the entire part of the side of the electronic circuit module component 1, 1a, it is possible to efficiently discharge the gas from the opening 5H, 5Ha with the electromagnetic wave shielding function being ensured.

Since the first resin 4 has the pores, strength of the first resin is somewhat lower than that of the second resin 9. In the case where both of the first resin 4 and the second resin 9 are partially exposed to the outside of the metal layer 5 as in the opening 5H shown in FIG. 2, the configuration is advantageous for the production process of the electronic circuit module component 1, 1a as described later in this specification. Also, since a thickness (dimension in a direction perpendicular to the substrate 3) of the first resin 4 is smaller than a thickness of the second resin 9, the height h of the opening 5Ha is reduced when only the first resin 4 is partially exposed to the outside of the metal layer 5a as in the opening 5Ha shown in FIG. 4. As a result, the metal layer 5a more effectively shields the electromagnetic wave. Also, in the case where lengths of the long sides of the opening 5H, 5Ha are equal to each other, it is possible to suppress an amount of moisture entering from the first resin 4.

The pores 4H of the first resin 4 is formed by blending a resin to be used as a base material of the first resin 4 into gaps of particles of a filler by adding the resin to the filler and curing the resin. In the case where porosity is lower than 1 vol %, the gas generated inside the electronic circuit module component 1, 1a is reduced in moving speed inside the first resin 4, thereby raising a risk of failure in efficiently suppressing the increase in component inner pressure. In the case where the porosity of the first resin 4 exceeds 50 vol %, the strength of the first resin 4 is reduced to raise a risk of easy cracking. Therefore, the porosity of the first resin 4 may preferably be greater than or equal to 1 vol % and smaller than or equal to 50 vol %. With such constitution, it is possible to reliably suppress the increase in component inner pressure in the secondary mounting while ensuring the strength of the first resin 4. In the case where the porosity is 30 vol % or less, it is possible to further enhance the strength of the first resin 4 as well as to ensure the moving speed of the gas generated inside the electronic circuit module component 1, 1a. Therefore, the porosity may more preferably be greater than or equal to 1 vol % and smaller than or equal to 30 vol %.

When an average diameter (D50) of the pores 4H of the first resin 4 is less than 0.1 μm, the speed of the gas generated inside the electronic circuit module component 1, 1a to move to the opening 5H, 5Ha is reduced to raise a risk of failure in efficiently suppress the increase in component inner pressure. When the average diameter (D50) of the pores 4H of the first resin 4 exceeds 10 μm, the strength of the first resin 4 is reduced to raise a risk of easy cracking. Therefore, from the viewpoints of effectively discharging the gas generated inside the electronic circuit module component 1, 1a and maintaining the strength of the first resin 4, the average diameter (D50) of the pores 4H may preferably be greater than or equal to 0.1 μm and smaller than or equal to 10 μm. Also, a distribution of the pores 4H may preferably be such that D50/(D90−D10) is within a range of 0.1 to 0.8. With such configuration, dispersion of the filler inside the first resin 4 and dispersion of pores 4H are improved.

In the case where diameters of a plurality of pores 4H are measured, the average diameter (D50) means a diameter (median diameter) detected when an integrated value is 50%, D90 means a diameter detected when an integrated value is 90%, and D10 means a diameter detected when an integrated value is 10%. A cut surface free from resin dripping was obtained by cutting the completed electronic circuit module component 1, 1a at an appropriate position and subjecting the cut surface to ion milling. The average diameter of the pores 4H was detected from an image obtained by photographing any three points of the cut surface by using a scanning electron microscope (SEM; magnification was 3000 times). The image obtained by the photographing was subjected to a binary processing so that only the pores are blackened. A distribution of the pores 4H was defined based on D50 obtained from the image, D10 corresponding to a cumulative frequency-diameter of 10%, and D90 corresponding to a cumulative frequency-diameter of 90%. Also, from the image obtained by photographing any three points of the cut surface by using the scanning electron microscope, porosity was calculated as a volume ratio of the pores. In the present embodiment and the modification example thereof, a ratio of an area of the pores in an entire area of the image obtained by the photographing is considered as the volume ratio of the pores.

Figure 9:
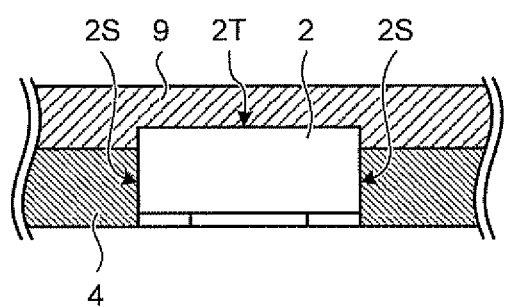
FIG. 9 is a diagram showing a relationship between a first resin and electronic components.

FIG. 9 is a diagram showing a relationship between a first resin and electronic components. As shown in FIG. 1 and FIG. 4, the above-described electronic circuit module component 1, 1a has the first resin 4 which covers the top parts of the electronic components 2, but the first resin 4 may not cover top parts 2T of the electronic components 2 as shown in FIG. 9. In this case, the first resin 4 is in contact with at least a part of a lateral part 2S of the electronic components 2 to ensure a path of a gas generated in the vicinity of the electronic components 2. With such configuration, the second resin 9 is in contact with the top parts 2T of the electronic components 2, so that the first resin 4 does not exist between the top parts 2T and the second resin 9. As a result, since it is possible to reduce the height of the electronic circuit module component 1, 1a by the elimination of the first resin 4 on surfaces of the top parts 2T of the electronic components 2, it is advantageous for height reduction of the electronic circuit module component 1, 1a. In order that the first resin 4 does not cover the top parts 2T of the electronic components 2, the first resin 4 is eliminated by an absorption roller or the like by rolling the absorption roller or the like on the top parts 2T after covering the electronic components 2 with the first resin 4.

Figure 10:
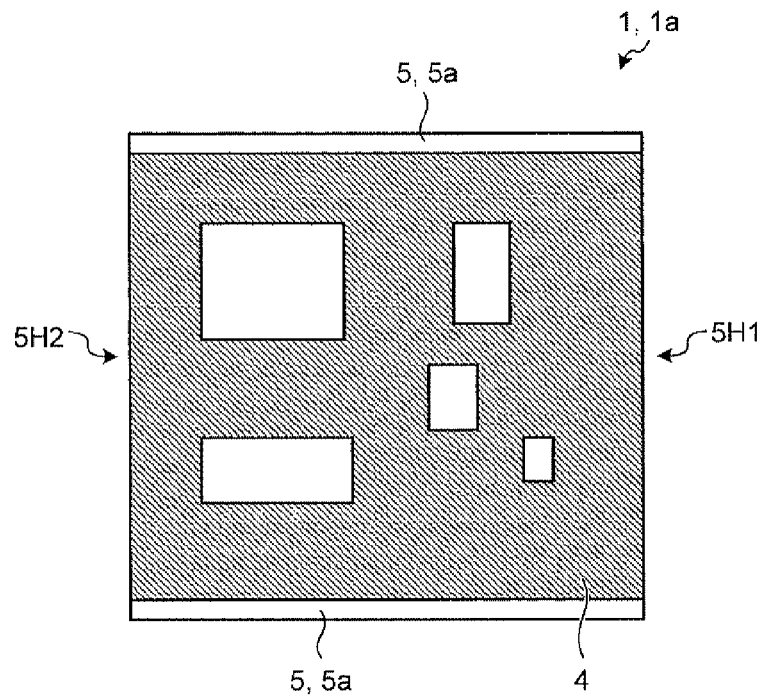
FIG. 10 is a plan view showing an arrangement example of an opening of the electronic circuit module component according to the present embodiment or the modification example thereof.
Figure 11:
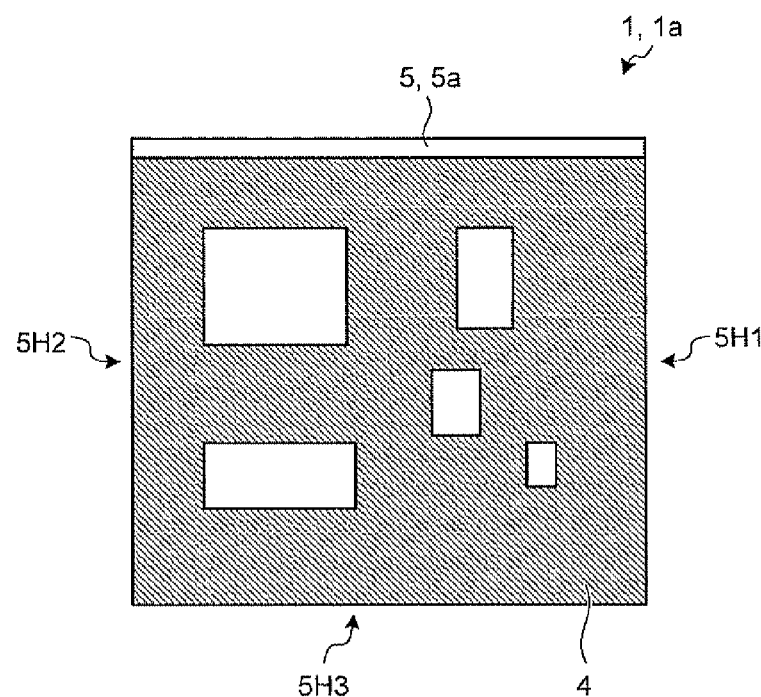
FIG. 11 is a plan view showing an arrangement example of an opening of the electronic circuit module component according to the present embodiment or the modification example thereof.

FIG. 10 and FIG. 11 are plan views showing an arrangement example of an opening of the electronic circuit module component according to the present embodiment or the modification example thereof. In FIG. 7, the electronic circuit module component 1, 1a having the quadrangular shape such as the oblong shape or the square shape in plan view has the opening 5H,5Ha on one of four sides. As shown in FIG. 10, the electronic circuit module component 1, 1a may have openings 5H1 and 5H2 on two of four sides and may have the metal layer 5, 5a on the remaining two sides. The openings 5H1 and 5H2 are disposed opposed to each other. Alternatively, as in the electronic circuit module component 1, 1a shown in FIG. 11, openings 5H1, 5H2, and 5H3 may be provided on three of four sides, and the metal layer 5, 5a may be provided on the remaining one side. The openings 5H1 and 5H2 are disposed opposed to each other, and the opening 5H3 is disposed opposed to the metal layer 5,5a. The openings 5H1, 5H2, and 5H3 may allow both of the first resin 4 and the second resin 9 to be partially exposed to the outside of the metal layer 5,5a as shown in FIG. 2 or may allow only the first resin 4 to be partially exposed to the outside of the metal layer 5a as shown in FIG. 5.

As described above, in the present embodiment and the modification example thereof, the number of openings of the electronic circuit module component 1, 1a is not limited to one. Since it is possible to reduce a distance difference between the plurality of electronic components 2 and the openings incorporated in the electronic circuit module component 1, 1a along with the increase in number of the openings, it is possible to more efficiently discharge the gas generated in the electronic circuit module component 1, 1a to the outside. As a result, it is possible to further reliably avoid the risk of the crack in the insulating resin and the deformation of the electronic circuit module component 1, 1a. Since the electromagnetic wave shielding function of the metal layer 5, 5a can sometimes be influenced by the increase in number of openings, it is preferable to set the number and the area of openings depending on a balance between the gas discharge and the shielding function.

The electronic circuit module component 1, is may most preferably have openings 5H and 5Ha on one side. With such configuration, it is possible to reliably suppress the crack in the insulating resin and expansion of the electronic circuit module component 1, is by reliably reducing the component inner pressure during the reflow in the secondary mounting, and the metal layer 5, 5a reliably exhibits the electromagnetic wave shielding property. However, this does not mean to exclude the electronic circuit module component 1, 1a having the openings 5H and 5Ha on two sides or three sides. For example, in the case where the secondary mounting of the electronic circuit module component 1, 1a is performed in a site of high humidity, it is considered that a large amount of moisture enters inside the electronic circuit module component 1, 1a. In this case, when the electronic circuit module component 1, 1a has the openings 5H and 5Ha on the two sides or three sides, a gas is efficiently discharged from the openings 5H and 5Ha during the reflow in the secondary mounting. As a result, it is possible to reliably suppress the crack in the insulating resin and the expansion of the electronic circuit module component 1, 1a even in the case where the large amount of moisture enters inside the electronic circuit module component 1, 1a.

Figure 12:
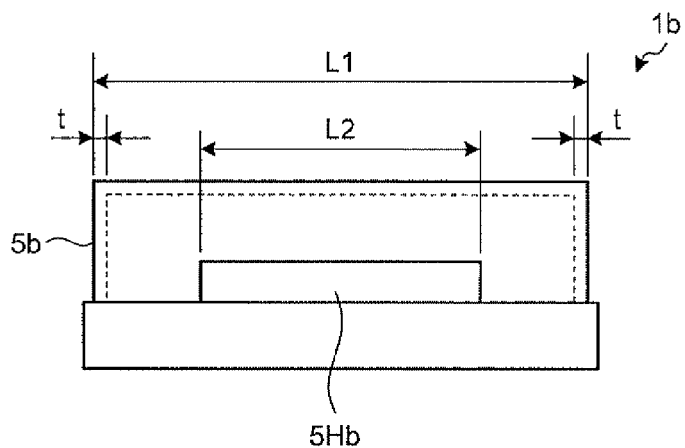
FIG. 12 is a side view showing another example of the opening of the electronic circuit module component according to the present embodiment or the modification example thereof.

FIG. 12 is a side view showing another example of the opening of the electronic circuit module component according to the present embodiment or the modification example thereof. An opening 5Hb of an electronic circuit module component 1b has a rectangular shape in plan view and is opened on a part of one side of the electronic circuit module component 1b which has a quadrangular shape such as an oblong shape and a square shape in plan view. When a thickness of a metal layer 5b is t; a length of the side of the electronic circuit module component 1b to which the opening 5Hb is provided is L1, and a length of a long side of the opening 5Hb is L2, L1>L2+2×t is satisfied. With such configuration, it is possible to more effectively exhibit an electromagnetic wave shielding function of the metal layer 5b.

The opening 5Hb may allow both of the first resin 4 and the second resin 9 to be partially exposed to an outside of the metal layer 5b as shown in FIG. 2 or may allow only the first resin 4 to be partially exposed to the outside of the metal layer 5b. The opening 5Hb may be provided on another side of the electronic circuit module component 1b which has the oblong shape, the square shape, or the like in plan view or a plurality of the openings 5Hb may be provided on one side. The shape of the opening 5Hb is not limited to the rectangular shape. The opening 5Hb is formed by etching a part on which the opening 5Hb is to be provided with a part of the metal layer 5b on which the opening 5Hb is not provide being masked with a resist or the like. Hereinafter, a method of manufacturing the electronic circuit module component according to the present embodiment will be described.

Figure 13:
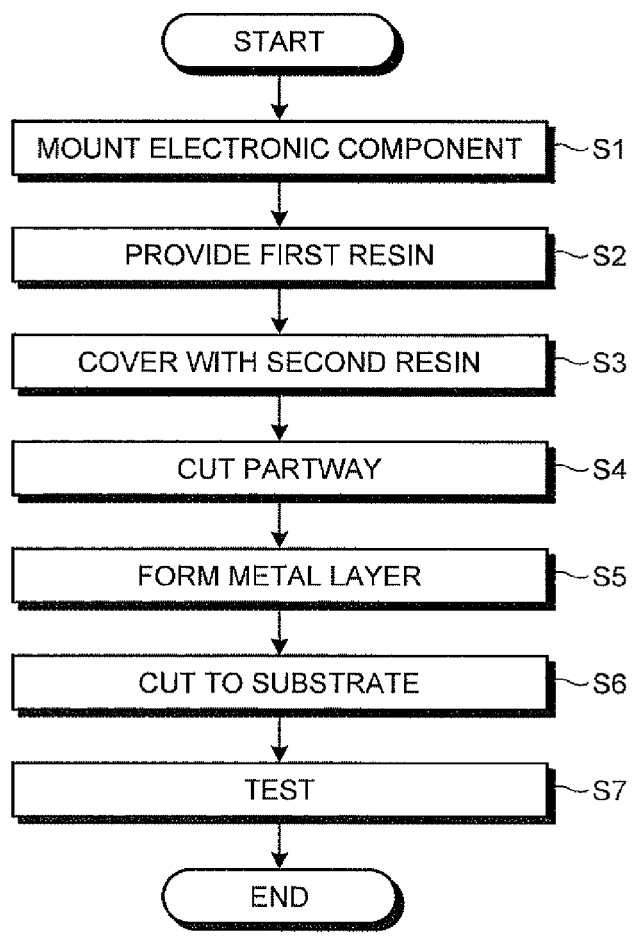
FIG. 13 is a flowchart showing a method of manufacturing the electronic circuit module component according to the present embodiment.

FIG. 13 is a flowchart showing a method for manufacturing the electronic circuit module component according to the present embodiment. FIG. 14A to FIG. 14F are diagrams illustrating the electronic circuit module component production method according to the present embodiment. FIG. 15 is a plan view showing a cutting position after covering the substrate to which the electronic components are mounted with a first resin and a second resin. To start with, one example of producing the electronic circuit module component 1 shown in FIG. 1 and FIG. 2 will be described. In Step S1, the electronic components 2 are mounted on the substrate 3 shown in FIG. 14A (mounting step). The ground 8 is provided inside the substrate 3. The substrate 3 in a state where the electronic components 2 are mounted thereto is referred to as a module body 1A.

The module body 1A is manufactured by the following process, for example.

(1) Printing a solder paste including the solder 6 on a terminal provided on a mounting surface of the substrate 3.
(2) Mounting the electronic components 2 to the substrate 3 by using a mounting device (mounter).
(3) Bonding terminals of the electronic components 2 and the terminal electrode of the substrate 3 to each other by heating the solder paste by placing the substrate 3 on which the electronic components 2 are mounted in a reflow furnace, melting the solder 6 of the solder paste, followed by curing.
(4) Cleaning flux residues adhered to surfaces of the electronic components 2 and the substrate 3.

Figure 14A:
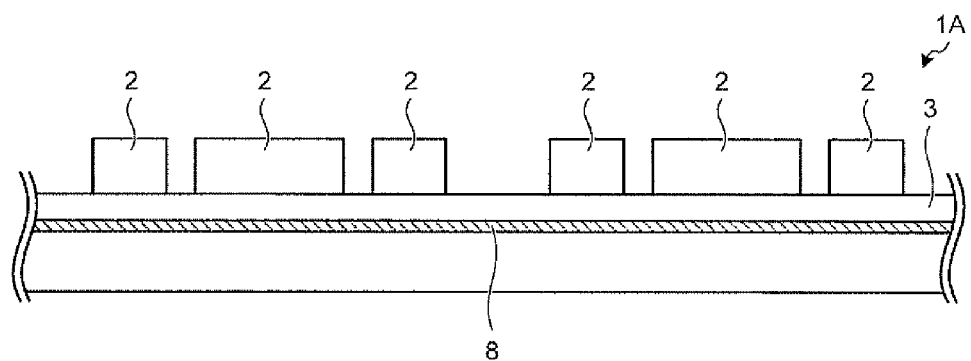
FIG. 14A is a diagram illustrating the electronic circuit module component production method according to the present embodiment.
Figure 14B:
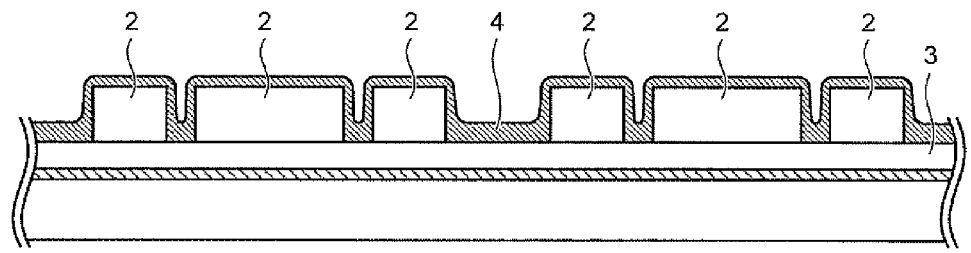
FIG. 14B is a diagram illustrating the electronic circuit module component production method according to the present embodiment.
Figure 15:
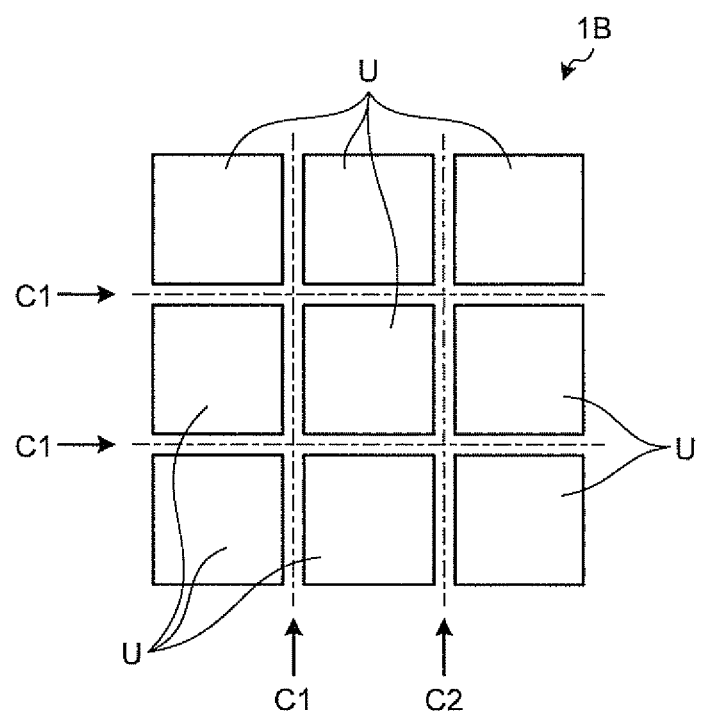
FIG. 15 is a plan view showing a cutting position after covering the substrate to which the electronic components are mounted with the first resin and a second resin.

After completion of the module body 1A, the process proceeds to Step S2, and the first resin 4 is provided on the substrate 3 as shown in FIG. 14B in such a manner that the first resin 4 is in contact with at least a part of the electronic components 2 of the module body 1A on the substrate 3 on which the electronic components 2 are mounted. In this example, the first resin 4 covers the electronic components 2 and the substrate 3. The first resin 4 is obtained by adding a filler (for example, silica or alumina) to a heat-curable resin (for example, an epoxy resin without limitation thereto) followed by curing. The first resin 4 is formed by coating a solution of the first resin 4 prepared by adding the filler to a solution of the heat-curable resin by dipping, nozzle-coating, curtain coating, or spin coating on a surface of the module body 1A (coating step), and heat-curing the heat-curable resin. Thus, the electronic components 2 and the substrate 3 are covered with the first resin 4 in which the pores 4H are formed by the blending of the resin into a part of gaps of filler particles.

The filler contained in the first resin 4 may have a shape similar to a spherical shape. With the use of such filler, it is possible to easily control a dimension, a shape, and a distribution of the pores 4H included in the first resin 4. However, the filler shape is not limited to the above-described shape. The filler to be contained in the first resin 4 may preferably have an average diameter (D50) of 1 μm to 10 μm, more preferably 2 μm to 7 μm. Also, a particle distribution of the filler may preferably be such that D50/(D90−D10) is within a range of 0.1 to 0.8. With such particle distribution, it is possible to easily disperse the filler and the pores 4H inside the first resin 4. In the measurements of diameters of a plurality of filler particles, the average diameter (D50) means a diameter (median diameter) detected when an integrated value is 50%, D90 means a diameter detected when an integrated value is 90%, and D10 means a diameter detected when an integrated value is 10%. The filler particle distribution was defined based on a number average value (median diameter) D50 measured by using a particle distribution meter, D10 corresponding to a cumulative frequency-diameter of 10%, and D90 corresponding to a cumulative frequency-diameter of 90%.

A type of the filler is not particularly limited insofar as the filler does not influence on electric characteristics of the electronic components 2 and the circuit of the electronic circuit module component 1, but the filler may preferably have good dispersibility into the heat-curable resin to be used for the first resin 4. For example, when a filler having an average diameter of less than 1 μm is used, the porosity is reduced by a reduction in size of pores or an increase in filling ratio of the filler into pores, thereby reducing the effect of suppressing the component inner pressure. When a filler having an average diameter larger than 10 μm is used, a film thickness when coating on the surface of the module body 1A is increased, thereby causing a necessity of increasing an outer shape height of the module component 1, 1a. Further, with the use of the filler having the average diameter of 10 μm or more, the strength of the formed first resin 4 is reduced to raise a risk of easily generating crack.

In the filler, a smaller average diameter (D50) and a larger average diameter (D50) may be combined. The filler average diameter (D50) may preferably be greater than or equal to 10 μm and smaller than or equal to 50 μm. An amount of the filler having the larger average diameter (D50) to be added may preferably be greater than or equal to 5 vol % and smaller than or equal to 30 vol % with respect to a total amount of the filler to be added. By mixing the fillers having the different average diameters as described above, it is possible to adjust a packing state of the filler particles. Thus, it is possible to easily realize the desired pore diameter and pore distribution by an appropriate resin blending. In the case of using the fillers having the different average diameters, the fillers of an identical type may be used, or fillers of different types (compositions) may be used, without particular limitation.

Figure 14C:
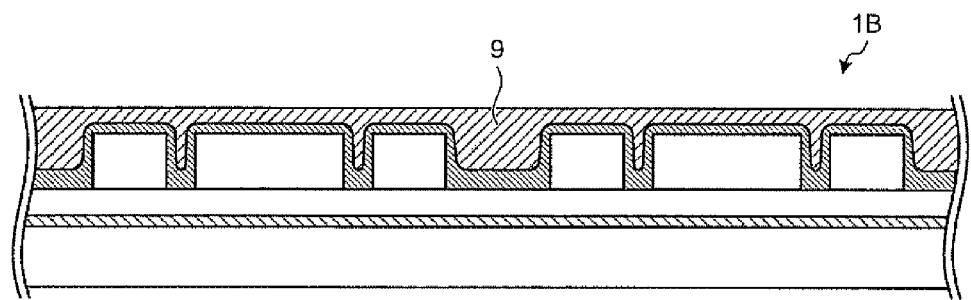
FIG. 14C is a diagram illustrating the electronic circuit module component production method according to the present embodiment.

After the solution of the first resin 4 is coated on the surface of the module body 1A, the heat-curable resin is cured by heating for a predetermined time (first curing step). Thus, the first resin 4 is provided on the surface of the module body 1A, so that the first resin 4 is in contact with at least a part of the electronic components 2. Subsequently, the process proceeds to Step S3 to cover the first resin 4 with the second resin 9 as shown in FIG. 14C. The second resin 9 is an epoxy resin, for example. In the present embodiment, a sheet-like material of the epoxy resin is placed on a surface of the first resin 4 (covering step), followed by heat-pressing, thereby curing the second resin 9 (second curing step). The surface of the first resin 4 is covered with the second resin 9 by the above-described method. As a result, the electronic components 2 are sealed by the second resin 9 via the first resin 4. The substrate 3 in this state is referred to as a sealed body 1B.

Figure 14D:
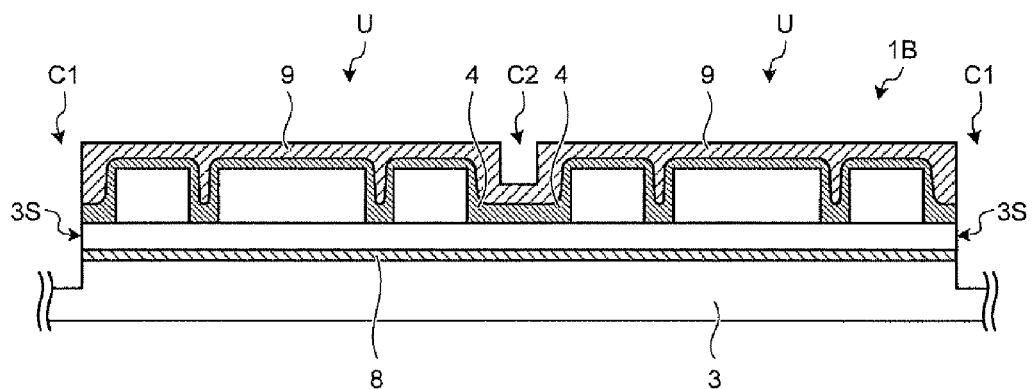
FIG. 14D is a diagram illustrating the electronic circuit module component production method according to the present embodiment.

Subsequently, the process proceeds to Step S4 to cut partway through the substrate 3 of the sealed body 1B by the unit (hereinafter referred to as module component unit) U of one electronic circuit module component 1 (half dicing) as shown in FIG. 14D. In this case, a position of a cutting line C1 is cut partway through the substrate 3, and a position of the cutting line C2 is cut partway through the second resin 9. The position of the cutting line C2 is the part on which the opening 5H shown in FIG. 1 and FIG. 2 is provided. An entire part of a rim of the module component unit U may be subjected to the half dicing. In Step S4 of the present embodiment, at least a part of the rim of a portion to be used as the electronic circuit module component 1 is cut partway through the substrate 3, and the rest of the portion is cut partway through a layer of the second resin 9 as described above. Since the second resin 9 is cut partway in the half dicing, the first resin 4 is not cut. Since the strength of the first resin 4 is lower than that of the second resin 9, it is possible to protect the first resin 4 by the second resin 9 by not cutting the first resin 4 in the half dicing. As a result, it is possible to avoid unnecessary cutting of the first resin 4 and to reliably provide the opening 5H.

A part of the first resin 4 appears at the position of the cutting line C1 by the half dicing, but a close contact property between the metal layer 5 and the first resin 4 is improved due to an increase in surface area by the pores 4H of the first resin 4. As a result, there is an advantage that a shape retention effect of the metal layer 5 formed on the part in which the first resin 4 appears is improved when forming the metal layer 5. The module component unit U is a region defined by the cutting lines C1 and C2 shown in FIG. 14D and FIG. 15.

The height h (see FIG. 2) of the opening 5H of the electronic circuit module component 1 will hereinafter be described. There is a risk that the first resin 4 is cut in Step S4 when the height h of the opening 5H is too small, and there is a risk that the electromagnetic wave shielding function of the metal layer 5 is influenced when the opening 5H is too large. From these viewpoints, the height h of the opening 5H is larger than the thickness of the first resin 4 and may preferably be within a range of from a height equal to the thickness of the first resin 4 to a height which is 5 times of the thickness of the first resin 4. The height h of the opening 5H may more preferably be within a range of from twice to three times of the thickness of the first resin 4. When the height h of the opening 5H is within the above-specified ranges, it is possible to reliably provide the opening 5H while avoiding the cutting of the first resin 4 in Step S4, thereby making it possible to reliably reduce the component inner pressure during the reflow in the secondary mounting. Also, when the height h of the opening 5H is within the above-specified ranges, the metal layer 5 satisfactorily exhibits the electromagnetic wave shielding function with the appropriate size of the opening 5H being maintained.

Figure 14E:
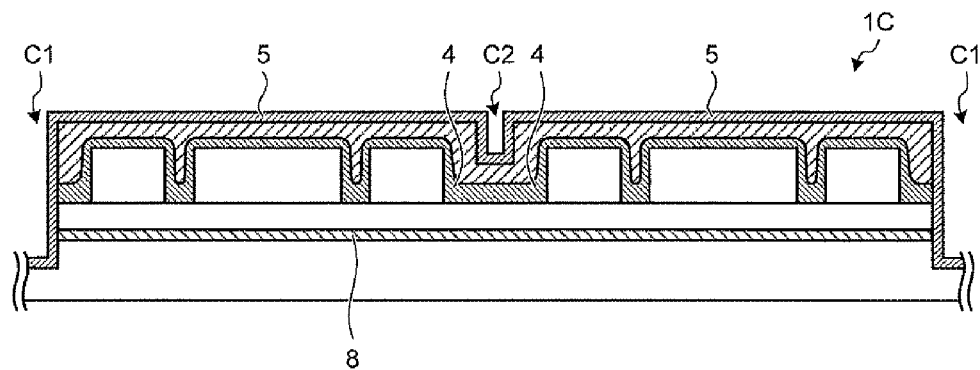
FIG. 14E is a diagram illustrating the electronic circuit module component production method according to the present embodiment.

When the Step S4 is finished, the process proceeds to Step S5. In Step S5, as shown in FIG. 14E, the metal layer 5 is formed on a surface of the sealed body 1B after the half dicing. The state in which the metal layer 5 is formed is referred to as a module assembly 1C. The metal layer 5 is obtainable by forming a first Cu layer by non-electrolytic plating, forming a second Cu layer by electrolytic plating, and forming a Ni layer as an anticorrosion layer by electrolytic plating. As shown in FIG. 14D, the ground 8 is exposed to a lateral surface 3S of the substrate 3 before the formation of the metal layer 5. Therefore, when the metal layer 5 is formed by Step S5, the metal layer 5 and the ground 8 are electrically connected to each other as shown in FIG. 14E. On the lateral surface 3S of the substrate 3, the ground 8 is exposed to an entire part of at least one side (three sides in this example) of the module component unit U which has an oblong shape, a square shape, or the like in plan view as shown in FIG. 15. Therefore, a connection area between the metal layer 5 and the ground 8 is increased to attain reliable conduction between the metal layer 5 and the ground 8.

Figure 14F:
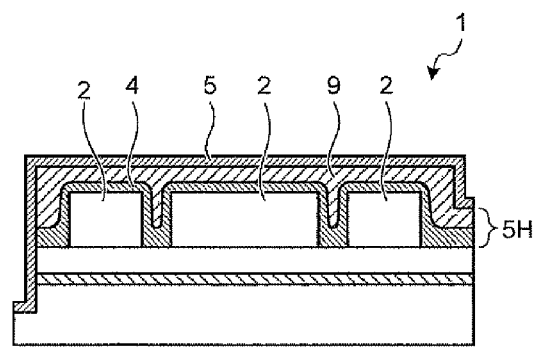
FIG. 14F is a diagram illustrating the electronic circuit module component production method according to the present embodiment.

When the metal layer 5 is formed, the process proceeds to Step S6, and the module assembly 1C is cut completely to the substrate 3 by the module component unit U. In other words, the substrate 3 is cut along the cutting lines C1 and C2. As a result, the electronic circuit module component 1 shown in FIG. 14F is obtained. The electronic circuit module component 1 which is tested in Step S7 and passed the test is accepted as a product. The above-described process is the process of the electronic circuit module component production method according to the present embodiment. By the above-described process, it is possible to manufacture the electronic circuit module component 1 shown in FIG. 14F, in which at least a part of the electronic components 2 is in contact with the first resin 4; the first resin 4 and the second resin 9 is covered with the metal layer 5; and the first resin 4 and the second resin 9 are partially exposed to the opening 5H. In the case where the entire rim of the module component unit U is subjected to the half dicing, the opening is formed on each of four sides of the module component having the quadrangular shape such as an oblong shape and a squire shape in plan view, and the first resin and the second resin are partially exposed to the openings.

Figure 16A:
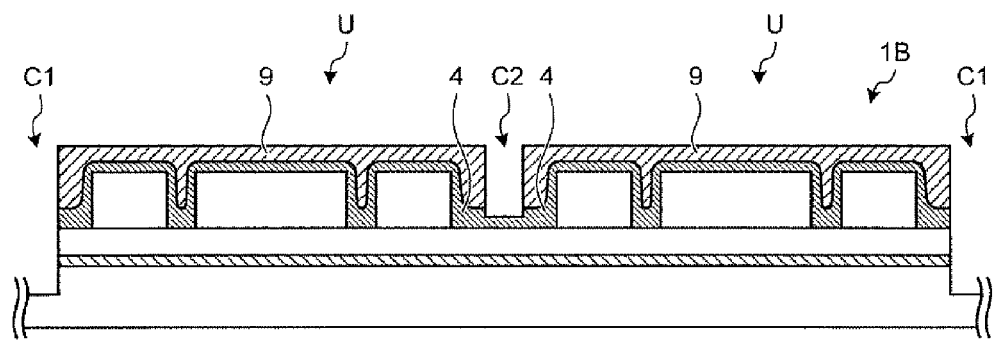
FIG. 16A is a diagram illustrating the electronic circuit module component production method according to a modification example of the present embodiment.
Figure 16B:
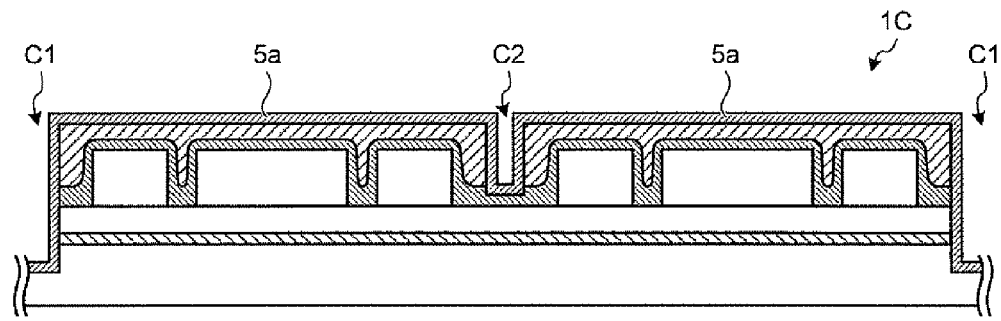
FIG. 16B is a diagram illustrating the electronic circuit module component production method according to the modification example of the present embodiment.
Figure 16C:
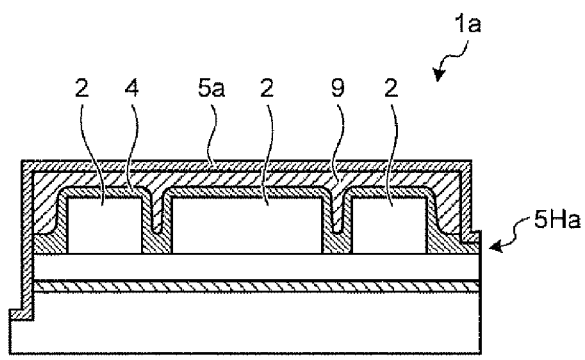
FIG. 16C is a diagram illustrating the electronic circuit module component production method according to the modification example of the present embodiment.

FIG. 16A to FIG. 16C are diagrams illustrating a method for manufacturing the electronic circuit module component according to a modification example of the present embodiment. The method for manufacturing the electronic circuit module component according to the present modification example is employed for manufacturing the electronic circuit module component 1a shown in FIG. 4 and FIG. 5. Step S1 to Step S3 are the same as those of the above-described method for manufacturing the electronic circuit module component 1. In Step S4, the substrate 3 of the sealed body 1B is cut partway by the unit (hereinafter referred to as module component unit) U of one electronic circuit module component 1a (half dicing) as shown in FIG. 16A. In this case, a position of a cutting line C1 is cut partway through the substrate 3, and a position of the cutting line C2 is cut partway through the first resin 4. The position of the cutting line C2 is the part on which the opening 5Ha shown in FIG. 4 and FIG. 5 are provided. In other words, in Step S4, a part of a rim of a portion to be used as the electronic circuit module component 1a is cut partway through the substrate 3, and the rest of the portion is cut partway through a layer of the first resin 4. In the half dicing, a height h of the opening 5Ha is adjusted by adjusting an amount of cutting the first resin 4. Since it is possible to reduce the height h of the opening 5Ha by cutting the first resin 4 to a part closer to the substrate 3, it is possible to minimize a reduction in electromagnetic wave shielding function of the metal layer 5a.

The height h (see FIG. 5) of the opening 5Ha of the electronic circuit module component 1a will hereinafter be described. There is a risk that the substrate 3 is cut in Step S4 to make it impossible to provide the opening 5Ha in the metal layer 5a when the height h of the opening 5Ha is too small. Also, there is a risk that the second resin 9 is partially exposed to the opening 5Ha when the height h of the opening 5Ha is too large. From these viewpoints, the height h of the opening 5Ha is smaller than the thickness of the first resin 4 and may preferably be within a range of from 0.1 times to 0.9 times of the thickness of the first resin 4. The height h of the opening 5Ha may more preferably be within a range of from 0.3 times to 0.8 times of the thickness of the first resin 4. When the height h of the opening 5Ha is within the above-specified ranges, it is possible to reliably provide the opening 5Ha while avoiding the cutting of the substrate 3 in Step S4, thereby making it possible to reliably reduce the component inner pressure during the reflow in the secondary mounting. Also, when the height h of the opening 5Ha is within the above-specified ranges, only the first resin 4 is partially exposed to the opening 5Ha, and the metal layer 5a satisfactorily exhibits the electromagnetic wave shielding property.

When the Step S4 is finished, the process proceeds to Step S5. In Step S5, the metal layer 5a is formed on a surface of a sealed body 1B after the half dicing to prepare a module assembly 1C. The method for forming the metal layer 5a is as described above. After the metal layer 5a is formed, the process proceeds to Step S6, and the module assembly 1C is completely cut to the substrate 3 by the unit of the module component unit U. As a result, the electronic circuit module component 1a shown in FIG. 16C is obtained. The electronic circuit module component 1a which is tested in Step S7 and passed the test is accepted as a product. The above-described process is the process of the electronic circuit module component production method according to the present embodiment. By the above-described process, it is possible to manufacture the electronic circuit module component 1a shown in FIG. 16B, in which at least a part of the electronic components 2 is in contact with the first resin 4; the first resin 4 and the second resin 9 are covered with the metal layer 5; and only the first resin 4 is partially exposed to the opening 5Ha.

Figure 17:
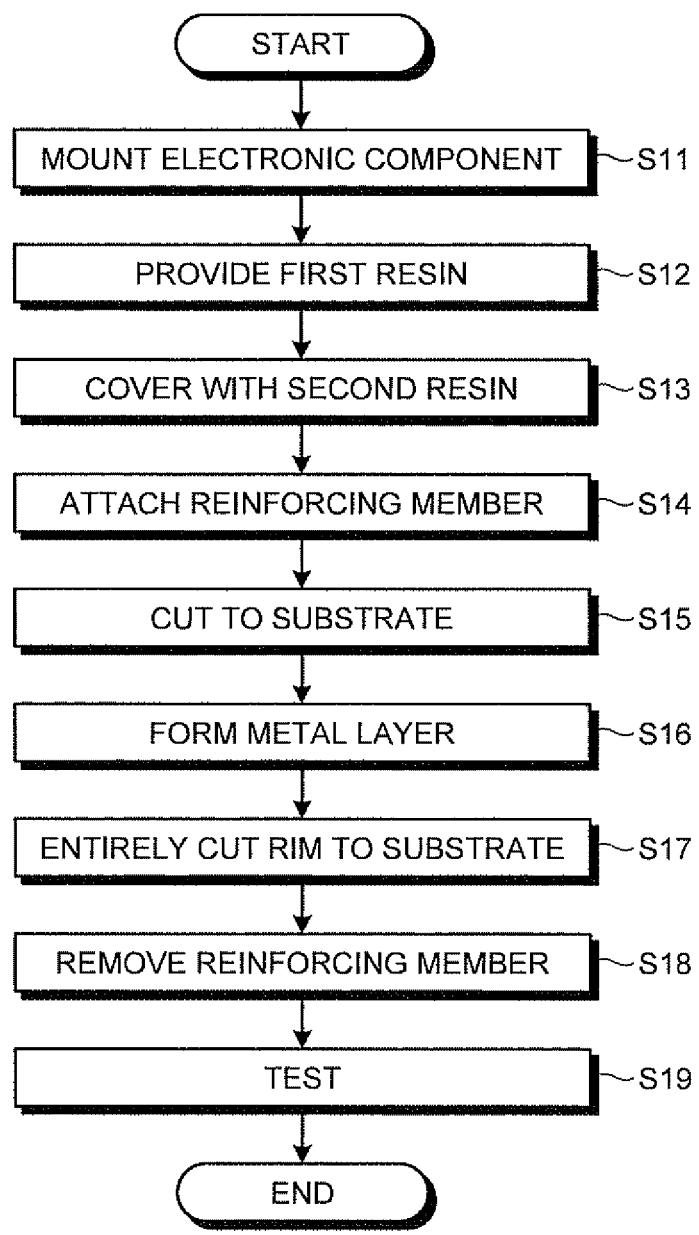
FIG. 17 is a flowchart showing a modification example of the electronic circuit module component production method according to the present embodiment.
Figure 18A:
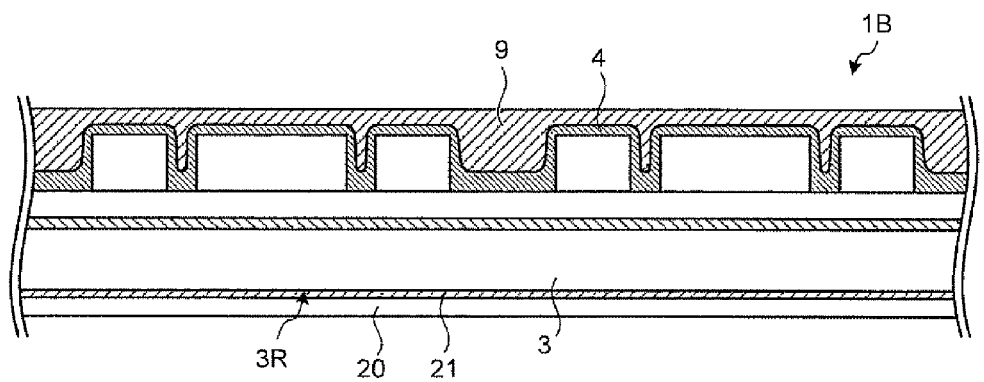
FIG. 18A is a diagram illustrating the modification example of the electronic circuit module component production method according to the present embodiment.

FIG. 17 is a flowchart showing a modification example of the electronic circuit module component production method according to the present embodiment. FIG. 18A to FIG. 18F are diagrams illustrating the modification example of the electronic circuit module component production method according to the present embodiment. FIG. 19A to FIG. 21B are plan views each showing a cutting position after covering the substrate to which the electronic components are mounted with the first resin and the second resin. Steps S11 to S13 are the same as Step S1 to Step S3 of the above-described method for manufacturing the electronic circuit module component 1, 1a. In Step S14, as shown in FIG. 18A, a plate-like reinforcing member 20 is attached by using an adhesive member 21 to a reverse side (hereinafter referred to as resin-opposite side) 3R of the substrate 3 of the sealed body 1B, which is reverse to the side on which the first resin 4 and the second resin 9 are provided. A type of the reinforcing member 20 is not limited, and the plate-like member used for the substrate 3 is used for the reinforcing member 20 in the present embodiment. A type of the adhesive member 21 is not limited, and a resist is used for the adhesive member 21 in the present invention.

Subsequently, the process proceeds to Step S15, and a part of a rim of a portion serving as one electronic circuit module component in the sealed body 1B is cut to the substrate 3 (first cutting step). In other words, the substrate 3 is entirely cut in a thickness direction (full dicing) by the unit of one electronic circuit module component (hereinafter referred to as module component unit) U. In the present embodiment, the substrate 3 is entirely cut in the thickness direction by cutting partway through the reinforcing member 20 attached to the resin-opposite side 3R of the substrate 3. A cutting line in this step is C1.

Figure 18B:
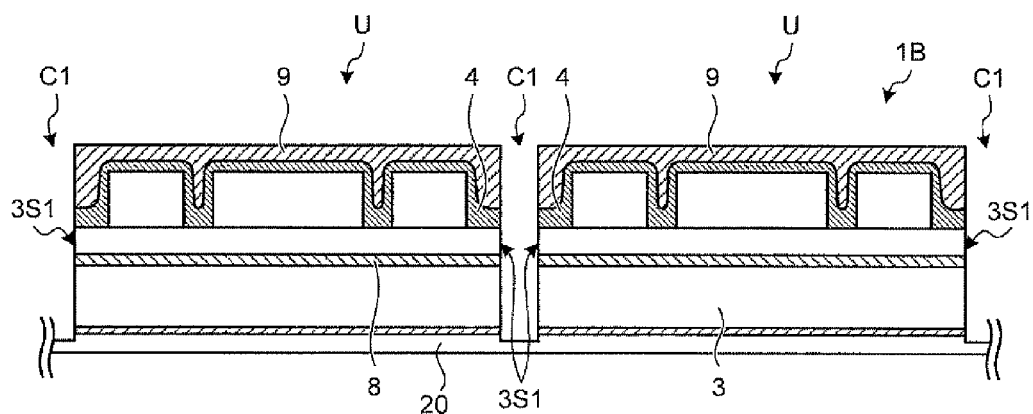
FIG. 18B is a diagram illustrating the modification example of the electronic circuit module component production method according to the present embodiment.
Figure 18C:
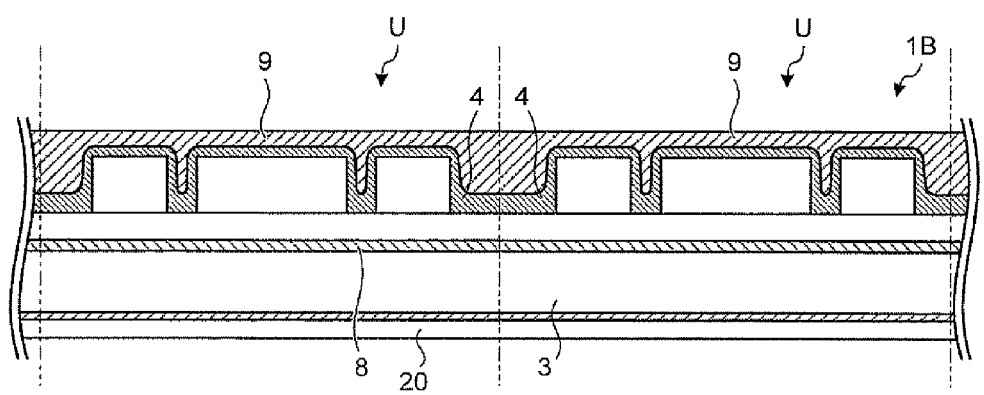
FIG. 18C is a diagram illustrating the modification example of the electronic circuit module component production method according to the present embodiment.
Figure 19A:
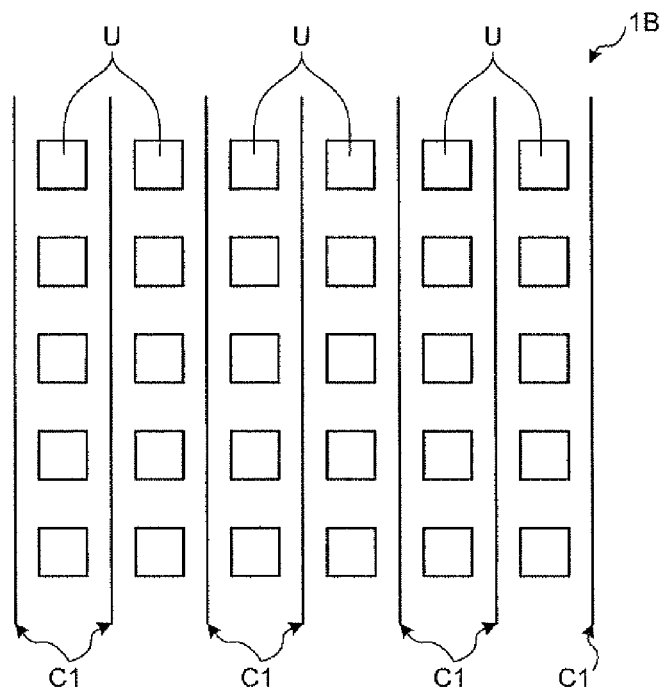
FIG. 19A is a plan view showing a cutting position after covering the substrate to which the electronic components are mounted with the first resin and the second resin.

As shown in FIG. 19A, the adjacent cutting lines C1,C1 separate the sealed body 1B in such a manner that the sealed body 1B has a plurality of groups each of which has a plurality of the module component units U aligned in a line. Also, the sealed body 1B which is cut along the cutting line C1 has a first cut surface 3S1 at a position of the cutting line C1 as shown in FIG. 18B. When the sealed body 1B is viewed from a direction perpendicular to the cutting line C1, the cut part does not appear in the sealed body 1B as shown in FIG. 18C. The reinforcing member 20 may be attached to the resin-opposite side 3R before the part of the rim of the portion to be used as one electronic circuit module component is cut to the substrate 3, i.e. before the first cutting step (Step S15). Thus, since the electronic circuit module component and the substrate are not separated from each other even when a rim of a portion to be used as the electronic circuit module component is cut to the substrate, it is possible to attain easy handling of an intermediate component (component before completion of the electronic circuit module component) in the production steps of the electronic circuit module component.

Figure 18D:
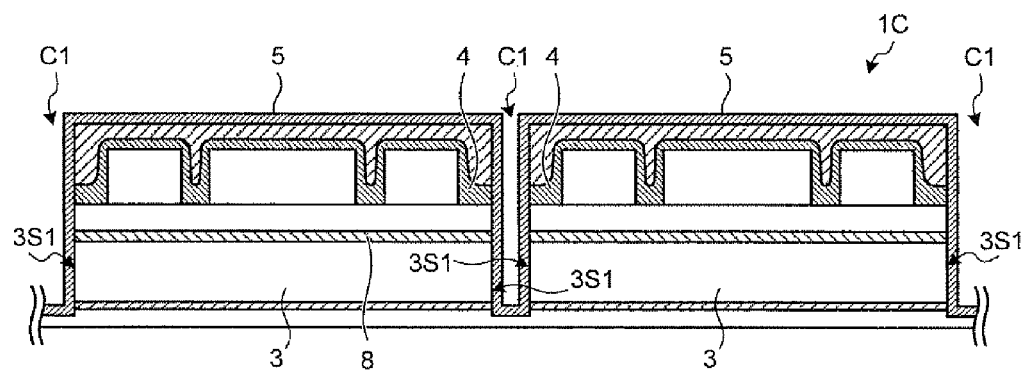
FIG. 18D is a diagram illustrating the modification example of the electronic circuit module component production method according to the present embodiment.

When Step S15 is finished, the process proceeds to Step S16. In Step S16, as shown in FIG. 18D, the metal layer 5 is formed on a surface of the sealed body 1B after the full dicing, thereby obtaining a module assembly 1C. More specifically, in Step S16, the metal layer 5 is formed on a surface of the second resin 9 of the sealed body 1B, the first resin 4 appeared on the first cut surface, and surfaces of the second resin 9 and the substrate 3. The method for forming the metal layer 5 is as described above. When the metal layer 5 is formed, the first cut surface 3S1 is covered with the metal layer 5.

Figure 18E:
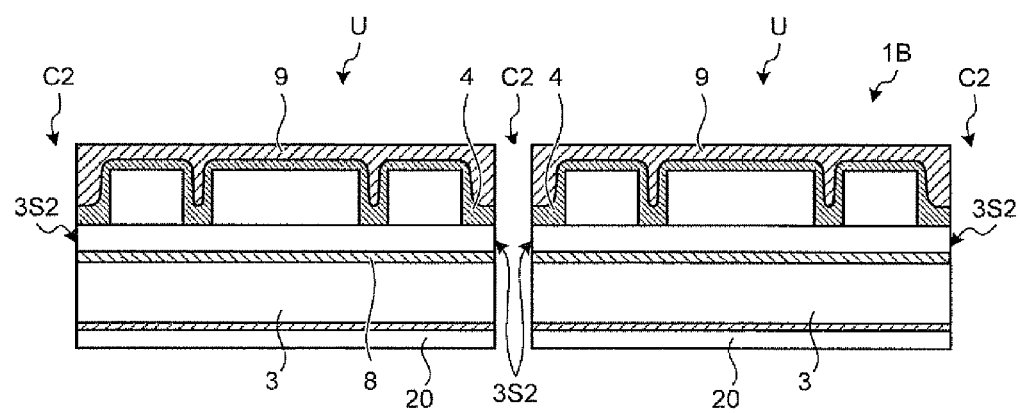
FIG. 18E is a diagram illustrating the modification example of the electronic circuit module component production method according to the present embodiment.
Figure 19B:
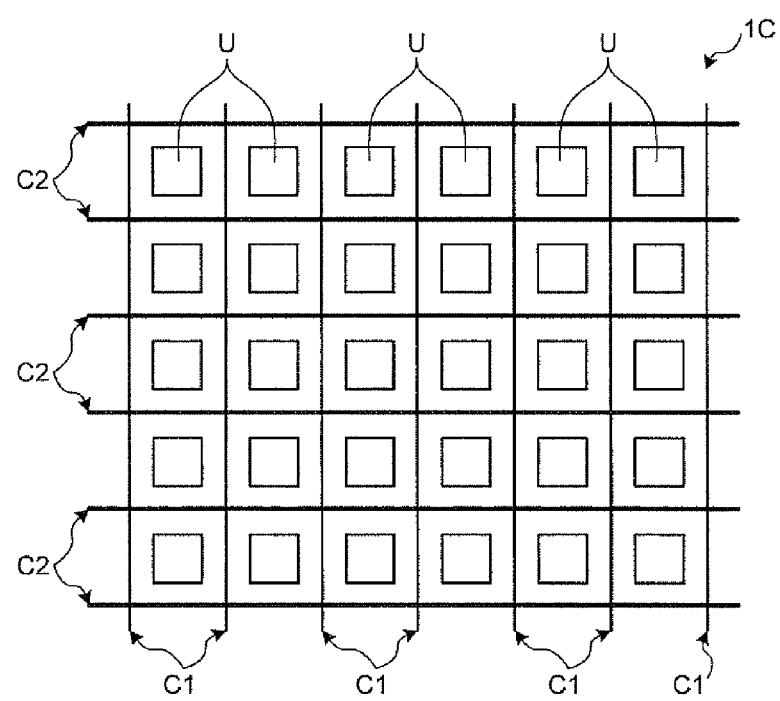
FIG. 19B is a plan view showing a cutting position after covering the substrate to which the electronic components are mounted with the first resin and the second resin.

After the metal layer 5 is formed, the process proceeds to Step S17, and the rim of the portion to be used as one electronic circuit module component in the module assembly 1C is entirely cut to the substrate 3 in a thickness direction (second cutting step) as shown in FIG. 18E. In short, the module assembly 1C is cut completely to the substrate 3 by the unit of the module component unit U. A cutting line in this step is C2. As shown in FIG. 19B, the cutting line C2 is perpendicular to the cutting line C1 and separates the module component units U which are adjacent to each other in a direction of extension of the cutting line C2. The module assembly 1C cut along the cutting line C2 has second cut surface 3S2 opposed to each other as shown in FIG. 18E. Subsequently, the process proceeds to Step S18 to remove the reinforcing member 20 from the substrate 3. In the case of using the resist as the adhesive member 21, the reinforcing member 20 is removed from the substrate 3 by dissolving the resist by using a dissolver.

Figure 18F:
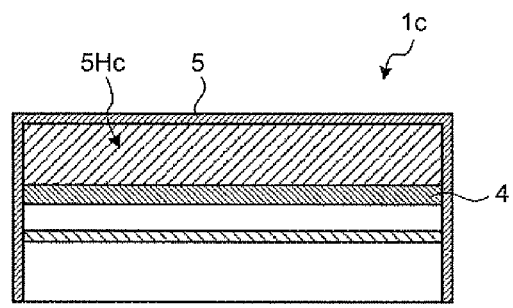
FIG. 18F is a diagram illustrating the modification example of the electronic circuit module component production method according to the present embodiment.

An electronic circuit module component 1c shown in FIG. 18F is obtained by the above-described process. The electronic circuit module component 1c which is tested in Step S19 and passed the test is accepted as a product. In the electronic circuit module component 1c, the cut surface 3S2 shown in FIG. 18E serves as an opening 5Hc. The electronic circuit module component 1c has the two first cut surfaces 3S1 and the two second cut surfaces 3S2. Therefore, the electronic circuit module component 1c has the two openings 5Hc.

The two second cut surfaces 3S2 and 3S2 are opposed to each other and perpendicular to the two first cut surfaces 3S1 and 3S1. The two first cut surfaces 3S1 are opposed to each other. As shown in FIG. 18F, the first resin 4 and the second resin 9 appear in the second cut surfaces 3S2, i.e. in the openings 5Hc. As described above, the modification example of the electronic circuit module component production method according to the present embodiment enables to manufacture the electronic circuit module component is in which the two openings 5Hc are provided, and the first resin 4 and the second resin 9 appear in each of the openings 5Hc, 5Hc.

Figure 20A:
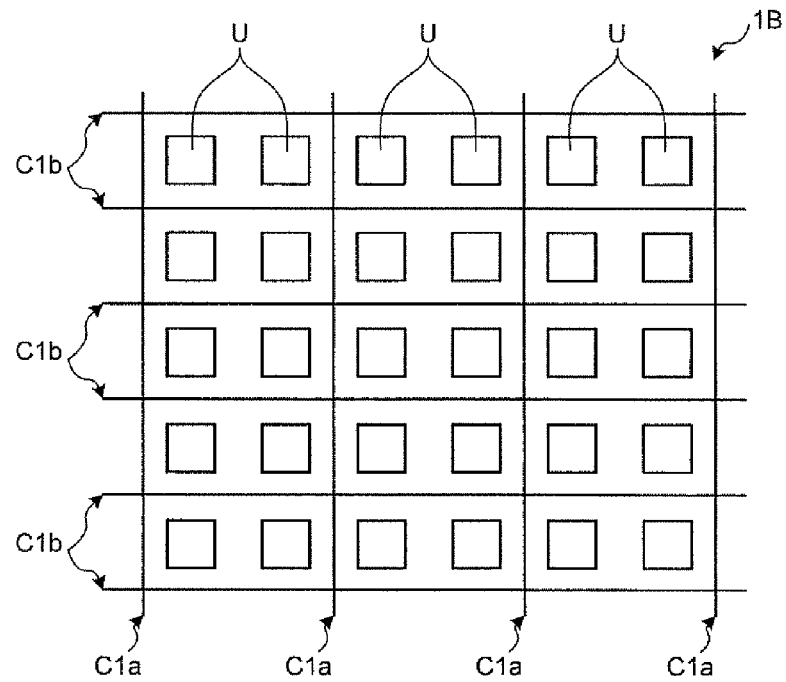
FIG. 20A is a plan view showing a cutting position after covering the substrate to which the electronic components are mounted with the first resin and the second resin.

In the first cutting step (Step S15), as shown in FIG. 20A, the sealed body 1B may be cut to the substrate 3 along a cutting line C1a and a cutting line C1b which are perpendicular to each other. The adjacent cutting lines C1a, C1a separate the sealed body 1B in such a manner that the sealed body 1B has a plurality of groups each of which has two lines of a plurality of the module component units U. The adjacent cutting lines C1b, C1b are perpendicular to the plurality of the cutting lines C1a and separate the sealed body 1B in such a manner that the sealed body 1B has a plurality of groups each of which has a line of a plurality of the module component units U.

Figure 20B:
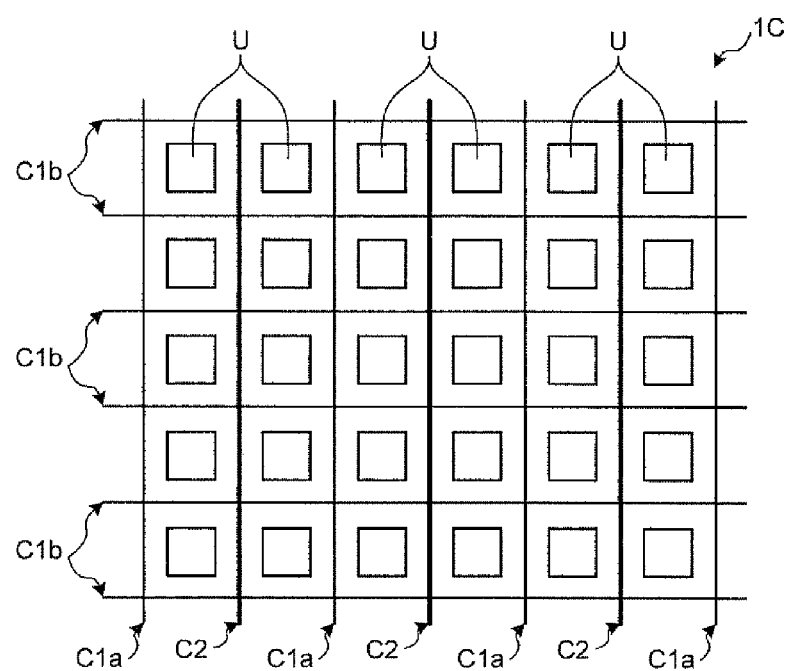
FIG. 20B is a plan view showing a cutting position after covering the substrate to which the electronic components are mounted with the first resin and the second resin.

In a second cutting step (step S17), the module assembly 1C is cut to the substrate 3 along the cutting line C2 which is parallel to the plurality of cutting lines C1a as shown in FIG. 20B. The cutting line C2 is a line for separating two module component units U, U aligned in a direction perpendicular to the cutting line C1a between the adjacent cutting lines C1a, C1a. In the thus-manufactured electronic circuit module component, the first resin 4, the second resin 9, and the substrate 3 are exposed at the part cut along the cutting line C2, and the part cut along the cutting lines C1a, C1b is covered with the metal layer 5. In other words, the electronic circuit module has one opening.

Figure 21A:
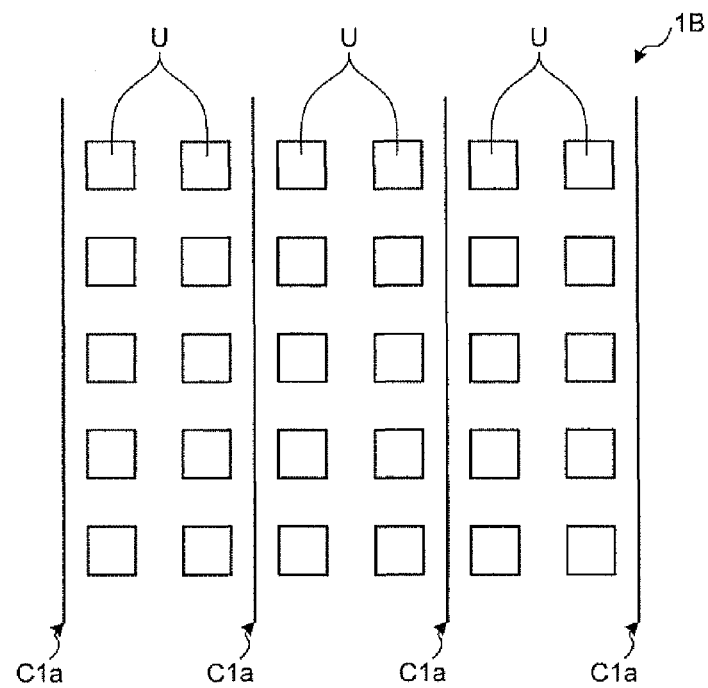
FIG. 21A is a plan view showing a cutting position after covering the substrate to which the electronic components are mounted with the first resin and the second resin.
Figure 21B:
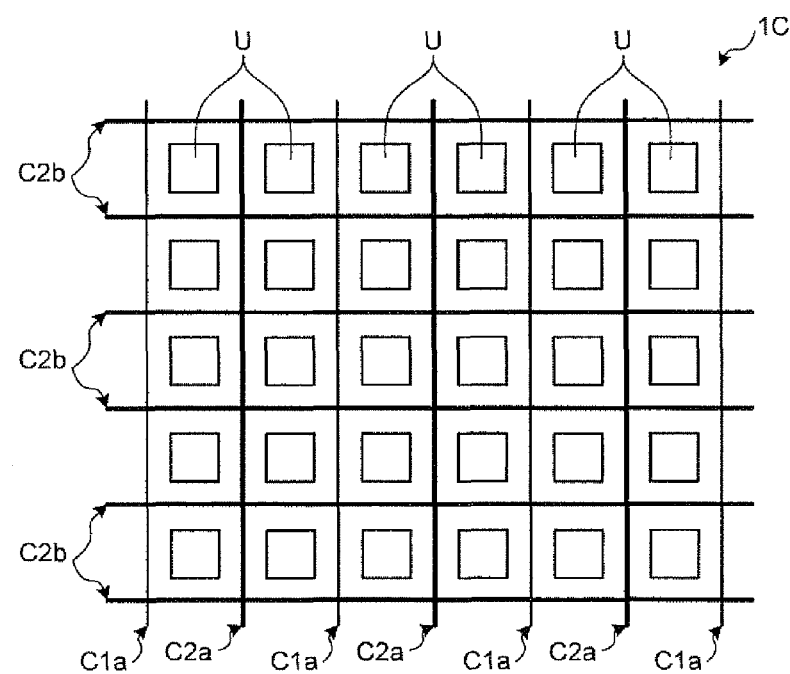
FIG. 21B is a plan view showing a cutting position after covering the substrate to which the electronic components are mounted with the first resin and the second resin.

In the first cutting step (Step S15), the sealed body 1B may be cut to the substrate 3 along the plurality of cutting lines C1a as shown in FIG. 21A. The adjacent cutting lines C1a, C1a separate the sealed body 1B in such a manner that the sealed body 1B has a plurality of groups each having two lines of the plurality of module component units U. Subsequently, in the second cutting step (Step S17), the module assembly 1C is cut to the substrate 3 along a cutting line C2a and a cutting line C2b which are perpendicular to each other.

The plurality of cutting lines C2a are parallel to the cutting line C1a. The cutting line C2a is a line for cutting the two module component units U,U which are aligned in a direction perpendicular to the cutting line C1a between the adjacent cutting lines C1a, C1a. Also, the cutting line C2b is a line for separating the plurality of module component units U aligned in a direction parallel to a direction of extension of the cutting line C1a. In the thus-manufactured electronic circuit module component, the first resin 4, the second resin 9, and the substrate 3 are exposed at the part cut along one cutting line C2a and two cutting lines C2b, and the part cut along the cutting line C1a is covered with the metal layer 5. In short, the electronic circuit module component has three openings.

As described above, the modification example of the electronic circuit module component production method according to the present embodiment enables to adjust the number of openings of the electronic circuit module component by changing the positions at which the sealed body 1B and the module assembly 1C are cut between the first cutting step and the second cutting step. The number of the openings can be changed within the range in which the electromagnetic shielding property of the metal layer 5 is exhibited. Insofar as the electromagnetic shielding property of the metal layer 5 is ensured, the number of the openings may preferably be 2. With such configuration, the electronic circuit module component has the symmetrical openings, and it is possible to enhance durability by suppressing imbalance stress which can be generated in the electronic circuit module component when the deformation due to heat or the like is caused.

Figure 22:
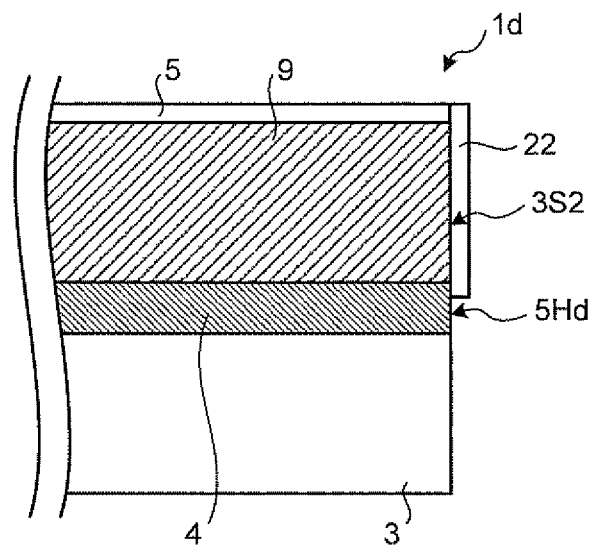
FIG. 22 is a partial sectional view showing an example of providing a conductive layer in the opening of the electronic circuit module component manufactured by the modification example of the electronic circuit module component production method according to the present embodiment.
Figure 23:
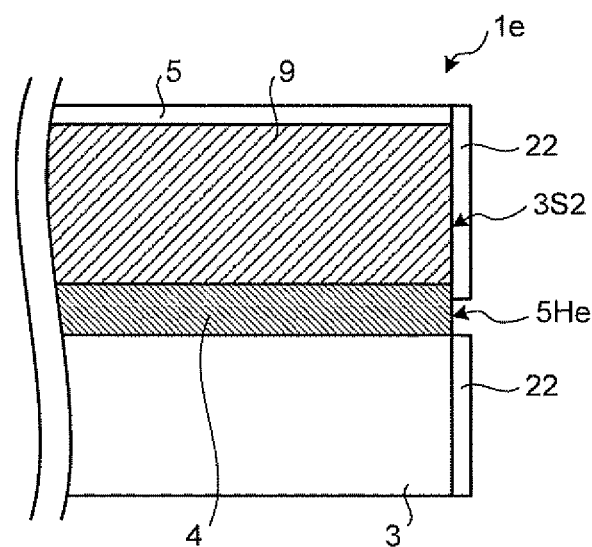
FIG. 23 is a partial sectional view showing another example of providing a conductive layer in the opening of the electronic circuit module component manufactured by the modification example of the electronic circuit module component production method according to the present embodiment.

FIG. 22 and FIG. 23 are partial sectional views showing examples of providing a conductive layer in the opening of the electronic circuit module component manufactured by the modification example of the electronic circuit module component production method according to the present embodiment. In the modification example of the electronic circuit module component production method according to the present invention, a cut surface may be covered with a conductive layer except for at least a part of a first resin appeared on the cut surface of one electronic circuit module component obtained after a rim is entirely cut to a substrate. With such configuration, it is possible to improve an electromagnetic shielding property of the electronic circuit module component.

For example, in an electronic circuit module component 1d shown in FIG. 22, a conductive layer 22 covers a second cut surface 3S2 except for at least a part of a first resin 4 appeared on the cut surface (second cut surface 3S2). More specifically, the conductive layer 22 covers a part of the first resin 4 and an entire part of the second resin 9 on the second cut surface 3S2 and is electrically connected to a metal layer 5. In the electronic circuit module component 1d, a part at which the first resin 4 is partially exposed serves as an opening 5Hd. Also, in an electronic circuit module component 1e shown in FIG. 23, a part of a first resin 4, an entire part of a second resin 9, and an entire part of a substrate 3 are covered with a conductive layer 22 on a second cut surface 3S2, and the conductive layer 22 and a metal layer 5 are electrically connected to each other. In the electronic circuit module component 1e, a part at which the first resin 4 is partially exposed serves as an opening 5He. On the second cut surface 3S2 in each of the electronic circuit module component 1d,1e, the entire part of the first resin 4 may be exposed with the rest of the second cut surface 3S2 being covered with the conductive layer 22.

In the present embodiment, a metal, a metal paste, or the like may be used for the conductive layer 22. As the metal, copper, silver, or the like may be used for the conductive layer. As the metal paste, a silver paste, for example, may be used for the conductive layer 22. The metal and the metal paste to be used for the conductive layer 22 are not limited to the above-described ones.

In the case of using the metal for the conductive layer 22, it is possible to form the conductive layer 22 on the second cut surface 3S2 of each of the electronic circuit module components 1d,1e by sputtering, vapor deposition, non-electrolytic plating, or the like. In the case of employing these methods, the sputtering or the vapor deposition is performed by covering the second cut surface 3S2 except for the part to be covered with the conductive layer 22 with resist or the like. Subsequently, the resist is removed, so that the second cut surface 3S2 is covered with the conductive layer 22 except for at least a part of the first resin 4 appeared on the second cut surface 3S2.

In the case of using the metal paste for the conductive layer 22, it is possible to form the conductive layer 22 on the second cut surface 3S2 of each of the electronic circuit module component 1d, 1e by transfer printing, coating by using roller, printing, or the like. In the case of using these methods, the metal paste is printed or transferred on the second cut surface 3S2 in such a manner that the conductive layer 22 covers the second cut surface 3S2.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic circuit module component comprising:
   an electronic component;
   a substrate on which the electronic component is mounted;
   a first resin having pores and being in contact with at least a part of the electronic component, an average diameter of the sores of the first resin being at least 0.1 µm, but not more than 10 µm;
   a second resin that covers the first resin and has a porosity lower than that of the first resin;
   a metal layer that covers the first resin and the second resin and is electrically connected to a ground of the substrate; and
   an opening that is provided in the metal layer and allows a part of the first resin to be exposed to an outside at least of the metal layer.

2. The electronic circuit module component according to claim 1, wherein the opening provided in the metal layer is a single opening.

3. The electronic circuit module component according to claim 1, wherein
   the electronic circuit module component has a quadrangular shape in plan view; and
   the opening is opened on an entire part of one side of the electronic circuit module component.

4. The electronic circuit module component according to claim 1, wherein the porosity of the first resin is greater than or equal to 1 vol % and smaller than or equal to 50 vol %.

* * * * *